(12) United States Patent
McDougall et al.

(10) Patent No.: US 7,394,255 B2
(45) Date of Patent: Jul. 1, 2008

(54) SINGLE-SIDED MAGNETIC RESONANCE MAGNET ASSEMBLY

(75) Inventors: Ian Leitch McDougall, Oxon (GB); Peter Hanley, Gloucestershire (GB)

(73) Assignee: Oxford Instruments PLC, Oxford (GB)

( * ) Notice: Subject to any disclaimer, the term of this patent is extended or adjusted under 35 U.S.C. 154(b) by 0 days.

(21) Appl. No.: 11/570,689

(22) PCT Filed: Jun. 24, 2005

(86) PCT No.: PCT/GB2005/002495

§ 371 (c)(1),
(2), (4) Date: Dec. 15, 2006

(87) PCT Pub. No.: WO2006/000791

PCT Pub. Date: Jan. 5, 2006

(65) Prior Publication Data

US 2007/0273380 A1    Nov. 29, 2007

(30) Foreign Application Priority Data

Jun. 28, 2004    (GB) ................. 0414431.7

(51) Int. Cl.
*G01V 3/00* (2006.01)
(52) U.S. Cl. .............. 324/319; 324/320; 335/296
(58) Field of Classification Search .......... 324/319, 324/320; 335/296, 297, 299
See application file for complete search history.

(56) References Cited

U.S. PATENT DOCUMENTS

| 4,398,150 | A | * | 8/1983 | Barjhoux et al. ............. 324/319 |
| 4,721,914 | A | * | 1/1988 | Fukushima et al. ......... 324/320 |
| 4,985,679 | A |   | 1/1991 | McDougall |
| 5,331,282 | A | * | 7/1994 | McDougall et al. ......... 324/319 |
| 5,659,281 | A | * | 8/1997 | Pissanetzky et al. ........ 335/296 |
| 5,744,960 | A |   | 4/1998 | Pulyer |
| 6,002,255 | A | * | 12/1999 | Pulyer ........................ 324/320 |

FOREIGN PATENT DOCUMENTS

| GB | 0324646.9 | 11/2003 |
| WO | 0131358 A | 5/2001 |

OTHER PUBLICATIONS

PCT Search Report dated Sep. 21, 2005 of Patent Application No. PCT/GB2005/002495 filed Jun. 24, 2005.

\* cited by examiner

*Primary Examiner*—Louis M Arana
(74) *Attorney, Agent, or Firm*—Vern Maine & Associates

(57) ABSTRACT

Magnetic resonance apparatus is provided comprising a magnet having a plurality of pairs of coils arranged in respective substantially parallel planes. The coils in each pair are operable in a counter-running manner when in use so as to generate a region of magnetic field spaced apart from said planes, having sufficient uniformity to enable magnetic resonance signals to be obtained from a target within the region. The magnetic field has a magnetic field direction Z lying substantially parallel to said planes and each of the coils is elongate in a direction X substantially parallel to said planes.

20 Claims, 16 Drawing Sheets racetrack gradients for d=1.5,b=1

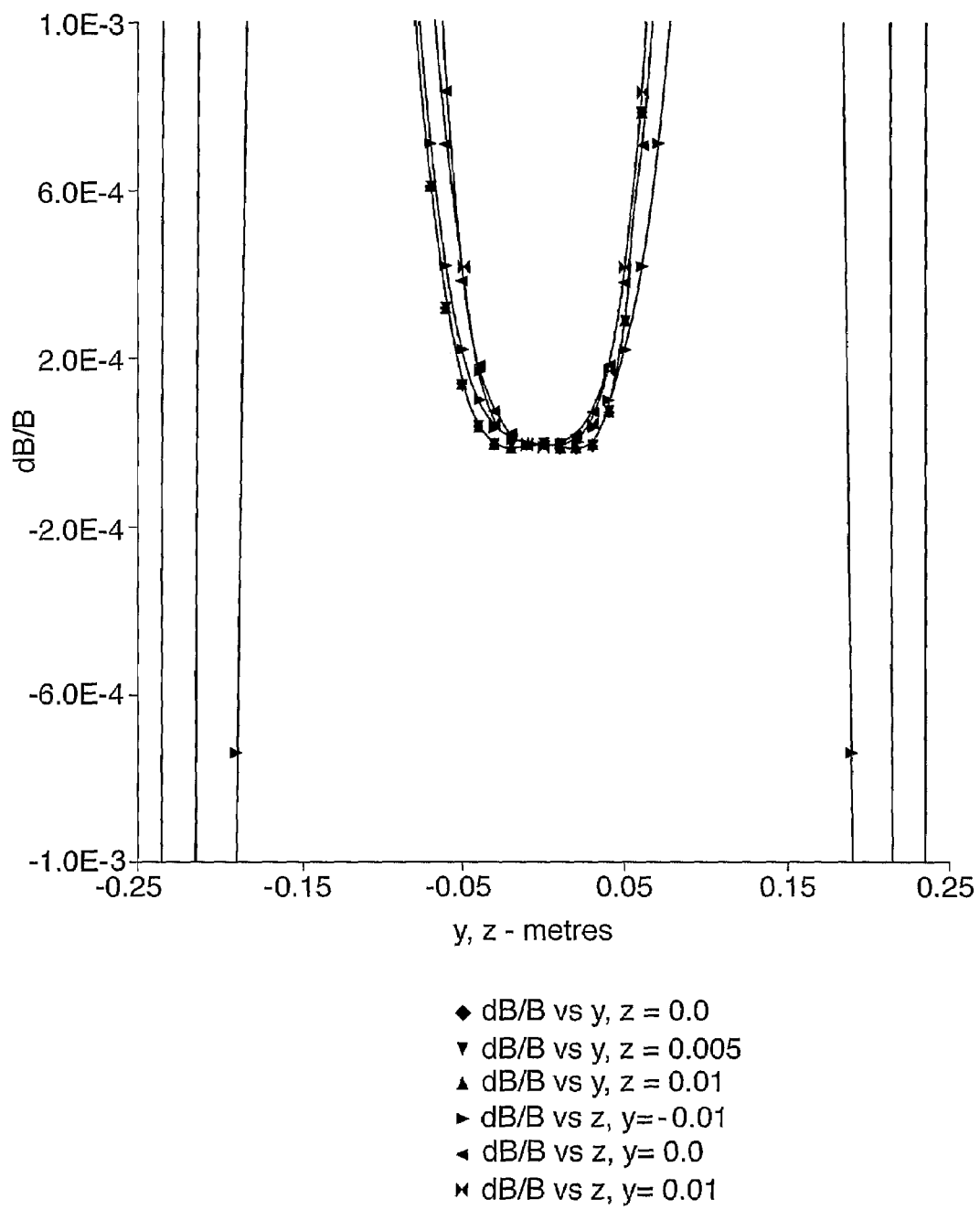

SINGLE-SIDED MAGNETIC RESONANCE MAGNET ASSEMBLY

The present invention relates to magnetic resonance apparatus for example to provide "open access" magnetic resonance imaging (MRI).

In magnetic resonance imaging procedures, a subject is placed within a "working region" of substantially homogenous magnetic field, this being generated with an appropriate magnet system, and magnetic resonance signals are obtained from the subject. Powerful magnets are needed to generate the working region which typically has a magnetic homogeneity (uniformity) in the range 1 to 100 parts per million. In the past such levels of homogeneity have often been achieved with the use of hollow-bored solenoid magnets, where the subject is placed within the bore that also contains the homogeneous region.

Whilst excellent results are achievable with this technique, there is an increasing interest in providing "open access" or "external field" MRI. There are various potential advantages of this, including the ability to perform simultaneous procedures upon the subject, such as surgery. Another advantage is that the subject may also be positioned as required, so as to maximise the benefit of the homogeneous working region and to allow imaging of certain tissues which would not normally be imageable unless at a particular angle with respect to the field. Open access systems may also prevent psychological problems such as claustrophobia which occur in some patients.

Some developments in open access MRI have been made to date, these including the production of short solenoid magnets in which only part of the patient is "inside" the apparatus. Another approach is to use split magnets such as "C-magnets" and air-cored split solenoids. Each of these approaches has some considerable limitations. The theoretical solution offering the best potential is that of single-sided arrangements.

In single-sided systems, the working region is positioned outside the envelope defining the magnet system and is therefore effectively "projected". This causes significant technological problems in that it is extremely difficult to produce a homogeneous magnetic field that is spaced apart from the magnet itself. A further problem of such systems is that large stray fields are produced which prohibit their installation in most hospital environments. There is therefore a strong desire to address these problems.

In accordance with the invention, we provide a magnetic resonance apparatus comprising a magnet having a plurality of pairs of coils arranged in respective substantially parallel planes, the coils in each pair being operable in a counter-running manner when in use so as to generate a region of magnetic field spaced apart from said planes, having sufficient uniformity to enable magnetic resonance signals to be obtained from a target within the region and having a magnetic field direction Z lying substantially parallel to said planes, wherein each of the coils is elongate in a direction X substantially parallel to said planes.

The present invention provides many advantages over prior art attempts at open access systems. In particular, it will be noted that the magnetic field direction Z within the region of magnetic field is substantially parallel to the planes defining the pairs of coils generating the field. This arrangement of coils provides a "single-sided" system that produces a useable volume of field uniformity. This provides a sufficiently well-defined flux-return path having good efficiency (and therefore high achievable field strengths) whilst at the same time reduces the extent of the stray fields.

Whilst the coils are said to be arranged in planes, preferably it is the effective centroids of the respective coil windings that define the planes.

The coils are elongate in at least the direction X such that for example their maximum dimension within the respective plane is in that direction. Preferably the plurality of coil pairs comprises first and second pairs of coils, the coils of each pair defining corresponding first and second substantially parallel planes, wherein the elongation of the coils in the direction X determines the dimension of the region in the direction X.

It will be appreciated therefore that the geometry and separation of the coils within each pair allows control of the extent of the usable region of substantially uniform magnetic field in the direction Z whilst the elongate nature of the coils allows the control of the size of the region in the direction X. Typically therefore the X and the Z directions are different directions and preferably these are mutually perpendicular and each lie parallel to the plane defined by the coils.

In some cases the first and second pairs of coils may be adapted to produce uniformity in the Z direction whereas in others, to produce uniformity in the Y direction.

An XZ plane arrangement produces a region of uniformity which may be narrow in the dimension perpendicular to each of the X and Z dimensions. Preferably in these cases therefore the magnet further comprises a third pair of coils defining a third plane, substantially parallel to the first and second planes, the third pair of coils being adapted to generate a corresponding magnetic field such that the region extends in a direction Y that is substantially perpendicular to the X and Z directions. This allows the production of a larger volume of region as is desirable for general magnetic resonance imaging procedures. Typically the coils of the third pair are also elongate in substantially the direction X and operated in a counter-running manner.

Preferably each of the coils in a pair is arranged substantially within a plane in that the axes of the coils in each case (which are substantially perpendicular to the turns) are substantially parallel to one another and substantially perpendicular to the planes.

Advantageously, the region generated by the magnet is preferably arranged to be to one side of and separate from the planes. This maximises the open-access nature of the system.

Various forms of elongate coil are envisaged to perform the invention, each having dimensions providing an aspect ratio which is greater than unity by a desired amount depending upon the application in question, for example the desired extent of the volume of uniformity. The coils within one or more pairs may therefore be substantially elliptical having a major elliptical axis in the direction X. However, preferably, part of each coil in one or more of the coil pairs is rectilinear in the direction X, more preferably two rectilinear parts in each coil are provided which are parallel with one another. The rectilinear parts may be joined at each end by sections defining a single curve, or two curves separated by a short rectilinear section thereby taking the form of a rounded rectangle. In one example racetrack coils are used which have parallel rectilinear sections coupled by semicircles.

It is preferable that each of the coils is of substantially the same length in the elongate direction X since the expanse of the sufficiently homogenous region of magnetic field in that direction is controlled primarily by the coils having the shortest elongate length in that direction.

Typically, the coil pairs each lie in their own respective planes which are parallel with one another. However, in some arrangements two or more of the planes may be co-planar and therefore share a common plane.

It should be noted that the coils are preferably formed from superconducting materials. High temperature superconductors are particularly beneficial for this task since their use is advantageous in the production of straight-sided coils. This is because straight conductors sections tend to bend under the Lorentz forces and the possible consequent release of strain energy can cause unacceptable temperature excursions in low-temperature superconductors where the specific heat is small.

We have also realised that, if the opposing ends (with respect to the direction X) of the coils are angled out of their respective plane, then greater magnetic homogeneity along the direction X may be obtained with respect to an arrangement with coils not so angled. This provides improved apparatus since the ratio of the homogeneous region size to that of the magnet is increased. The coils in all arrangements are also preferably air-cored.

For some coils arrangements such as those designed by considering XZ plane uniformity, in order to produce a region of sufficient magnetic uniformity, preferably the coils are adapted such that the fourth derivative of the magnetic field with respect to the direction Z is substantially zero. Preferably the coils are also adapted such that the second derivative of the magnetic field with respect to the direction Z is cancelled. Furthermore, preferably the coils are adapted such that the first derivative of the magnetic field with respect to the direction Y is cancelled. The coils may also be adapted (for example by the addition of further coils) such that the derivatives of order greater than 2, of the magnetic field with respect to the direction Y are cancelled. Preferably, odd orders are cancelled by symmetry.

In other systems designed by considering uniformity in the XY plane, preferably the coil pairs are adapted such that the first derivative of the magnetic field with respect to the direction Y is zero and the second derivative of the magnetic field with respect to the direction Y is cancelled. Alternatively, the second derivative of the magnetic field with respect to the direction Y may be zero and the first derivative of the magnetic field with respect to the direction Y is cancelled.

Although the extent of the volume of uniformity in the direction X is controlled by the elongation of the coils in that direction, this extent with respect to the elongation can be improved by the addition of two pairs of coils having a relatively short elongation in the direction X, and two pairs of coils having a relatively long elongation in the direction X. The coil current is then arranged to flow in one sense in one pair of each length, and in the opposite sense for the other pair of each length so as to cancel the second and fourth derivatives of the magnetic field with respect to the direction X.

It will be noted that the apparatus herein is described primarily in connection with use in the field of magnetic resonance imaging. Other magnetic resonance techniques may be used in combination the apparatus of the present invention, one of which being the method described in the co-pending British patent application number GB0324646.9 where adaptive magnetic field gradients are described. The present apparatus can therefore be used in conjunction with the method described in GB0324646.9, and in particular in accordance with the example given in FIG. 3 of that application relating to single-sided systems.

Whilst apparatus for magnetic resonance imaging is primarily described herein, it will be appreciated that other magnetic resonance procedures such as spectroscopy or relaxation time measurements could be performed with the apparatus, due to the homogeneous region used, although particular benefit is provided in magnetic resonance imaging for medical applications. The principles underlying the apparatus are therefore described although it will be appreciated by one skilled in the art that conventional cryostats, control systems and other support apparatus can be used or modified within the skill of the ordinary person in the art so as to implement a working system.

Some examples of apparatus according to the present invention will now be described with reference to the accompanying drawings in which:

FIG. 5 shows the form of $G_z$ gradients as a function of a;

FIG. 31 shows the ratio of $G_4$ to $G_2$ as a function of coil length for the sixth example.

Figure 1:
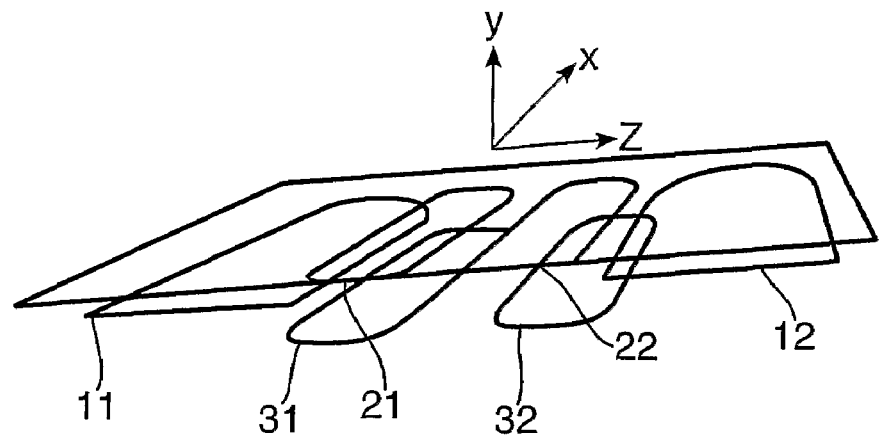
FIG. 1 shows a co-ordinate system adopted in association with the examples.

In what follows, we define a coordinate system such that the magnetic field is predominantly in the Z-direction and the magnetic system is bounded by a plane parallel to the X and Z directions at a distance y=d. This is shown in FIG. 1.

Figure 2:
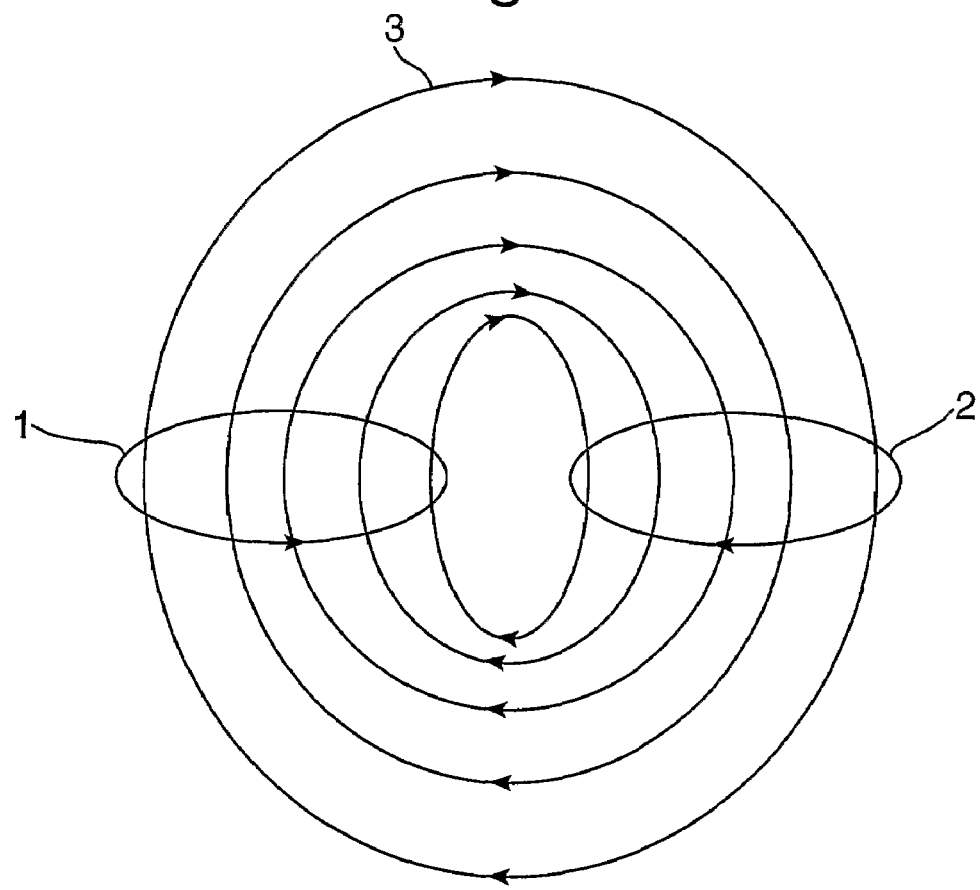
FIG. 2 shows the magnetic field according to two counter-running loops.

If we now consider the simple system shown in FIG. 2, consisting of two side-by-side, coplanar, counter-running coils (indicated by arrows), forming a pair 1, 2, it can be seen that this produces a magnetic field 3 at some distance from their plane which is in the required Z direction. Also, at distances large compared with the dimensions of the coils, their nett dipole moment is effectively zero, so that the stray field is small at these distances.

The simple system described above clearly does not produce a magnetic field sufficiently uniform for magnetic resonance methods. We now go on to describe how a system of such coils can be made to produce a magnetic field which is sufficiently uniform over a volume (region), defined as a "working volume".

In accordance with the invention the magnetic field uniformity can be improved in the X-direction by replacing the circular coils with elongate coils such "racetrack" coils. In the Z-direction uniformity can be improved by including a second pair of counter-running coils.

Figure 3:
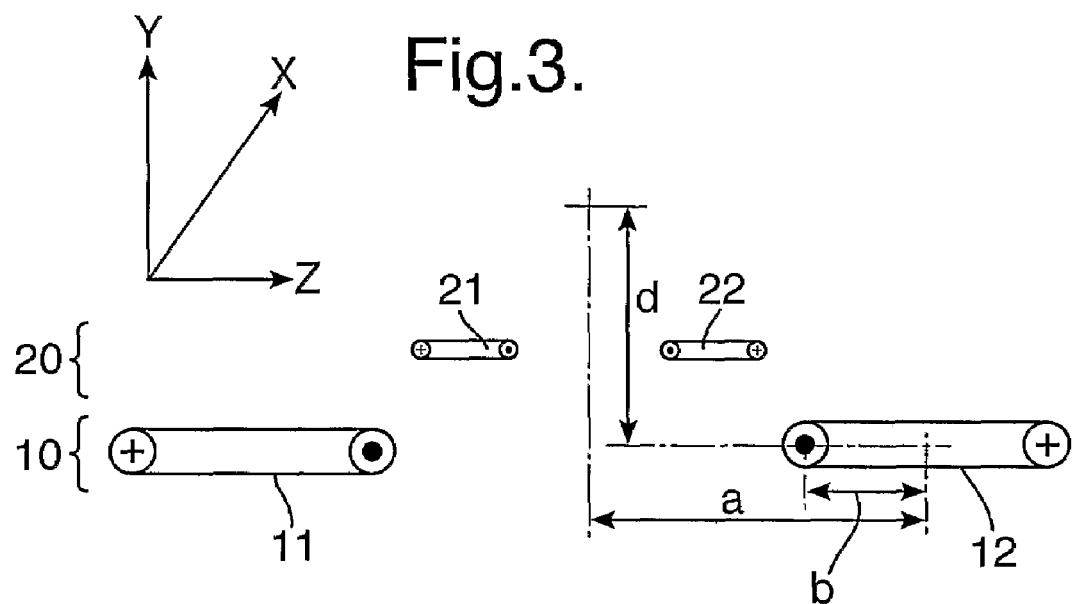
FIG. 3 shows a cross-section through coils according to a first example.

An arrangement of two pairs of racetrack coils is shown in FIG. 3. FIG. 3 shows a view in cross-section of two pairs of racetrack coils. A first pair 10 comprises coils 11 and 12 and a second pair 20 comprises coils 21 and 22. As shown in FIG. 3, the first pair 10 of coils 11, 12 lie in a plane parallel with the X-Z plane and at a particular co-ordinate Y. The second pair 20 comprising coils 21 and 22 lie in a second plane which is parallel to the first plane and is also therefore parallel to the X-Z plane. However, the second plane may be at a different Y co-ordinate and so may be above, below or coincident with the first. The currents in each coil of each pair are counter-running with respect to one another, that is the current in coil 11 flows in the opposite sense to that in coil 12, and similarly for coils 21 and 22.

The coils in this case are characterised by their horizontal (Z) distance from the field centre, a, their half-width, b, and their vertical (Y) distance from the field centre d. On the mid X-Y plane, the field is in the Z-direction.

Figure 4:
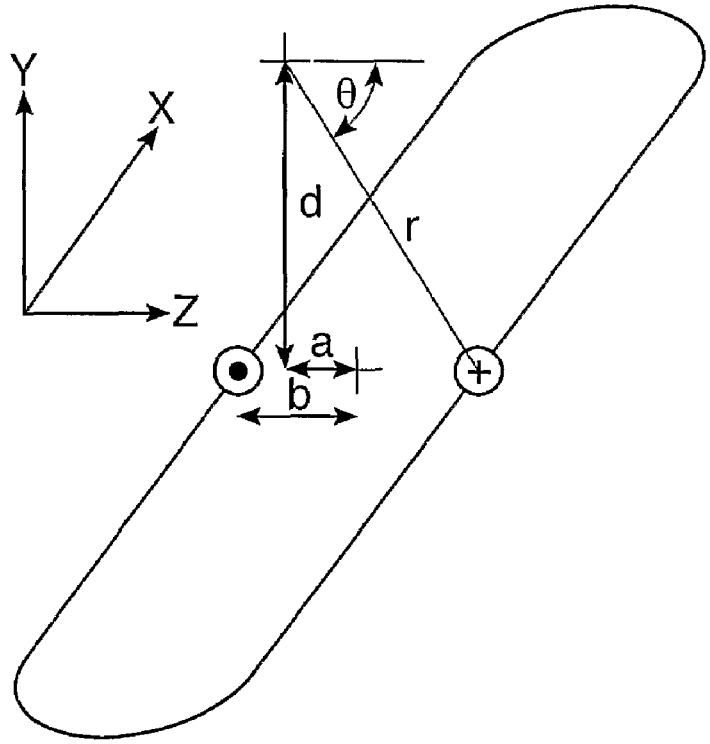
FIG. 4 shows a polar co-ordinate system used to describe the coil arrangement.

Consider now the characteristics of a single coil as shown in FIG. 4, here using polar co-ordinates from the Z axis having an origin at d=0. The Z-component of the field is:

$$B_z = \sum \frac{\mu_0 I}{2\pi r}\cos\theta = \frac{\mu_0 I(y-d)}{2\pi((y-d)^2+(z-a+b)^2)} - \frac{\mu_0 I(y-d)}{2\pi((y-d)^2+(z-a-b)^2)}$$

ignoring end-effects. From this the magnetic field gradients can be calculated, for example, for the fourth order gradient in Z:

$$G_{z4} = \frac{\partial^4 B_z}{\partial z^4}\bigg|_{y=0,z=0}$$

The full expressions are:

$$G_{z0} = \frac{\mu_0 Id}{2\pi}\left\{\frac{1}{r_1^2} - \frac{1}{r_2^2}\right\}$$

$$G_{z2} = -\frac{\mu_0 Id}{\pi}\left\{\frac{1}{r_1^4} - \frac{1}{r_2^4} - \frac{4(b-a)^2}{r_1^6} + \frac{4(b+a)^2}{r_2^6}\right\}$$

$$G_{z4} = \frac{12\mu_0 Id}{\pi}\left\{\begin{array}{c}\frac{1}{r_1^6} - \frac{1}{r_2^6} - \frac{12(b-a)}{r_1^8} + \frac{12(b+a)^2}{r_2^8} + \\ \frac{16(b-a)^4}{r_1^{10}} - \frac{16(b+a)^4}{r_2^{10}}\end{array}\right\}$$

where $r_1^2 = d^2+(b-a)^2$ and $r_2^2 = d^2+(b+a)^2$

Figure 5:
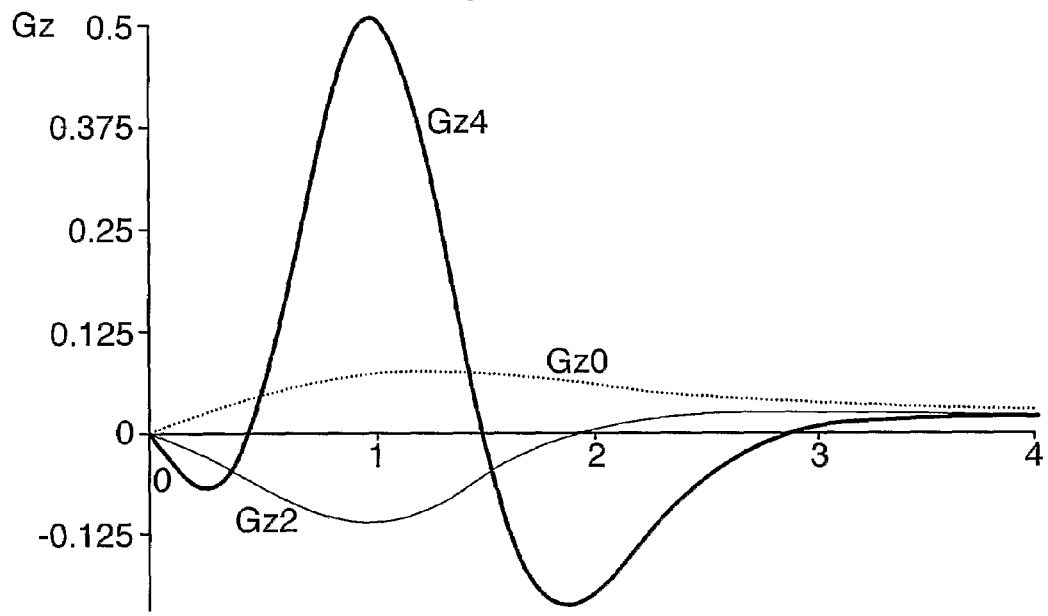

The behaviour of these gradients for zeroth, second and fourth order (in this case for $\mu_0 I=1, d=1.5$ and $b=1$) is shown in FIG. 5.

It can be seen in FIG. 5 that the $4^{th}$ order gradient goes through several zeroes, and that the $2^{nd}$ order gradient changes sign. It should therefore be possible to select two pairs of coils so that:

Odd order gradients cancel by virtue of being a pair;

$4^{th}$ order gradients are zero for both pairs; and

Ampere-turns for the coils can be chosen so that $2^{nd}$ order gradients cancel while reinforcing the field.

The zeroes of the $4^{th}$ order gradient are given in Table 1 for values of "a" in units of "b".

TABLE 1

| d/b | | | a/b | | |
|---|---|---|---|---|---|
| 0.2 | 0.0 | 0.7247053486 | 0.9350163823 | 1.06498372 | 1.27527999 |
| 0.3 | 0.0 | 0.5866429422 | 0.9025295989 | 1.097472746 | 1.412955622 |
| 0.5 | 0.0 | 0.2821365952 | 0.8377120674 | 1.162385084 | 1.688863449 |
| 0.7 | 0.0 | | 0.7738154559 | 1.226962635 | 1.966893595 |
| 1.0 | 0.0 | | 0.6794361024 | 1.322469561 | 2.391830366 |
| 1.5 | 0.0 | | 0.4420876815 | 1.480946012 | 3.128540298 |
| 2.0 | 0.0 | | | 1.653777675 | 3.899239028 |

TABLE 1-continued

| d/b | a/b | | |
|---|---|---|---|
| 2.5 | 0.0 | 1.852443035 | 4.695476056 |
| 3.0 | 0.0 | 2.074808804 | 5.509433644 |
| 5.0 | 0.0 | 3.091175127 | 8.85687347 |

We will generally want a>b to avoid overlapping coils, so that the last two columns in Table 1 are the most relevant. Using this analysis we can now calculate a range of systems and investigate their properties using this approach.

The procedure here is to choose a value for b and for each of the values of d/b in Table 1, then calculate d and two values of a. The second-order gradients corresponding to each of these are then calculated and the current ratio chosen so that they cancel. The efficiency, in terms of $B_0/NI$ is shown plotted in FIG. 6 against d for various values of b, for coplanar conductors.

Figure 6:
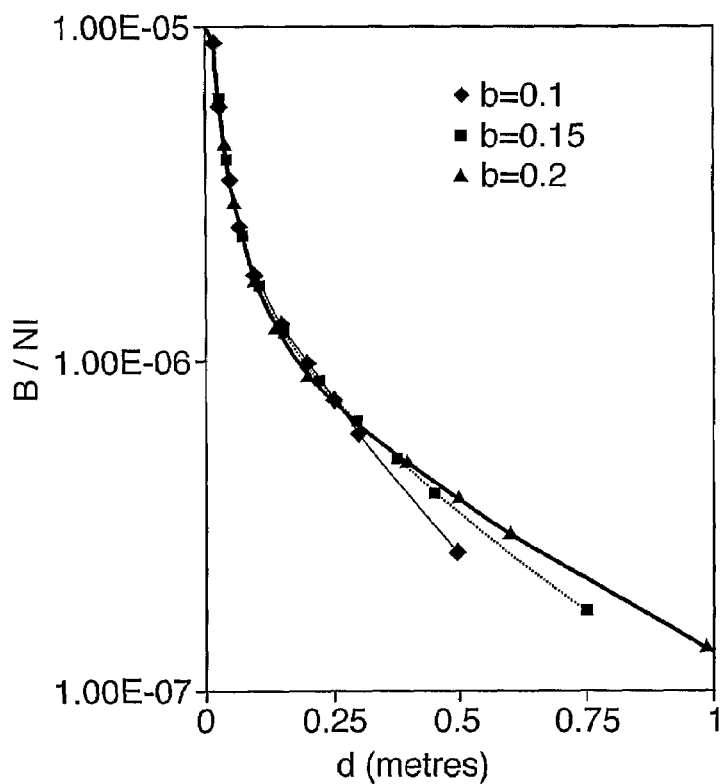
FIG. 6 shows efficiency values for arrangements with various b.

It can be seen in FIG. 6 that, within practical limits, the efficiency depends only weakly on b. We are therefore at liberty to choose b to suit homogeneity requirements, available space and so on.

Figure 9:
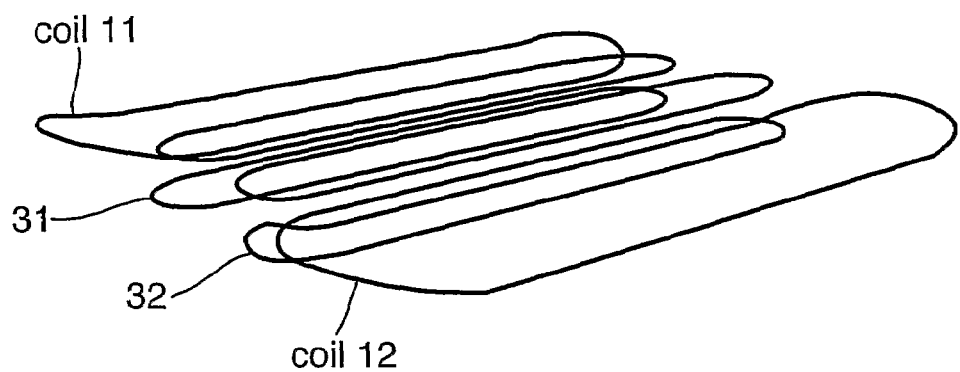
FIG. 9 shows the first example arrangement with coils having tilted ends.

The addition of a third pair of counter-running racetrack coils advantageously allows the Y-gradient to be cancelled in the Z direction (see coils 31, 32 of pair 30 in FIGS. 1 and 9). The expression for this gradient is:

$$\frac{\partial B_z}{\partial y} = G_{y1} = \frac{-\mu_0 I}{2\pi}\left\{\frac{1}{r_1^2} - \frac{1}{r_2^2} - 4d^2\left(\frac{1}{r_1^4} - \frac{1}{r_2^4}\right)\right\}$$

Values for this can therefore be tabulated for different values of b and d with a taking the values for zero $G_{z2}$. A design procedure is to take a coil with a selected value of b and d and with a at the larger of the values which give zero for $G_{z4}$. Values of b and d can then be given for the other two coils and $G_{z2}$ and $G_{y1}$ calculated corresponding to the smaller value of a which gives zero $G_{z4}$ for each coil. The current ratios can then be found by solving the equations $$G_{z2}^{(1)}I_1 + G_{z2}^{(2)}I_2 + G_{z2}^{(3)}I_3 = 0$$

$$G_{y1}^{(1)}I_1 + G_{y1}^{(2)}I_2 + G_{y1}^{(3)}I_3 = 0$$

where the superscripts refer to the first, second and third coil pairs.

An example of a practical implementation of the invention is now described. The description above assumes that end effects can be ignored. In practice, because the coils are of finite length some adjustments are desirable. However, the above analysis provides a good starting point, and further adjustments are refinements rather than modifications to the basic design and in any case are within the ambit of one skilled in the art.

Using this as a starting point, we choose as an example, a system with the parameters shown in Table 2:

TABLE 2

| coil | a | b | d | $\frac{a}{b}$ | $\frac{d}{b}$ | $\frac{I}{I_0}$ | I* |
|---|---|---|---|---|---|---|---|
| 1 | 0.4783660732 | 0.2 | 0.2 | 2.391830366 | 1 | 1 | 2638522 |
| 2 | 0.1480946012 | 0.1 | 0.15 | 1.480946012 | 1.5 | 0.3388591 | 894087 |
| 3 | 0.1852443035 | 0.1 | 0.25 | 1.852443035 | 2.5 | −0.9745496 | −2571370 |

*denotes ampere-turns for 1 tesla. Dimensions are in meters. Coils 1, 2, 3 are coil pairs 10, 20, 30 respectively.

Figure 7:
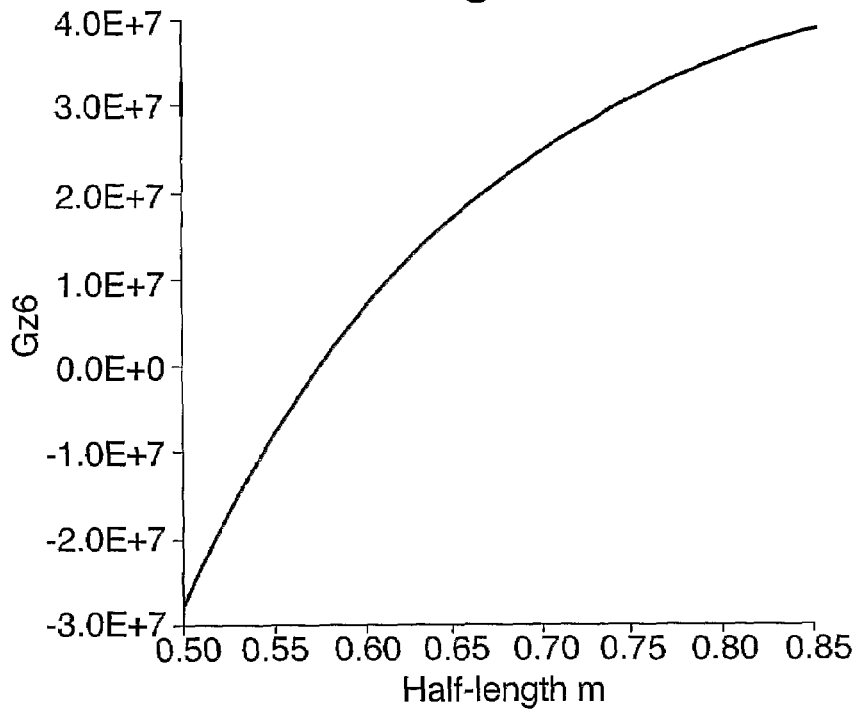
FIG. 7 shows the variation in the sixth order field gradient as a function of the half-length of the system.

In order to optimise the field uniformity in the Z-direction, we note that the 6th order gradient, $G_{z6}$ is a function of the length of the coil system, as shown in FIG. 7.

Figure 8:
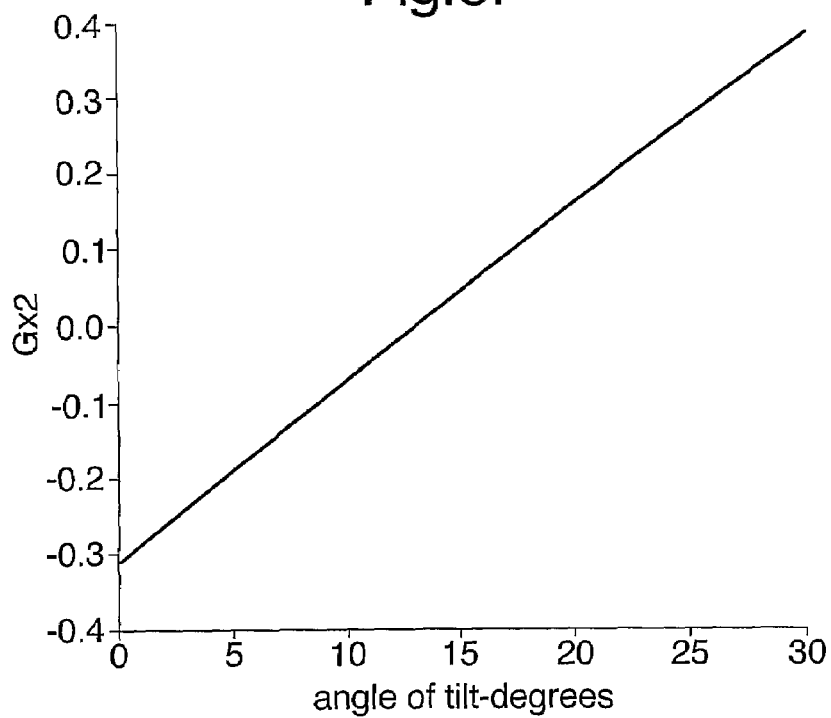
FIG. 8 shows the effect of tilting the coil ends upon the $G_{x2}$ gradient.

We therefore choose a half length of 0.575 metres, that is, a zero value for $G_{z6}$. In the X-direction, the dominant gradient is second order, $G_{x2}$ and this can be cancelled by tilting the ends of the main coils, 11 and 12 with the other coils remaining fully planar. The effect on $G_{x2}$ is shown in FIG. 8.

In this case, we choose an angle of 13 degrees by which to tilt the ends of the coils 1 and 4 as shown in FIG. 9.

These adjustments mean that the "a" values of the coils be modified slightly to recover zero $G_{z4}$ and then the currents recalculated for zero $G_{z2}$.

Figure 10:
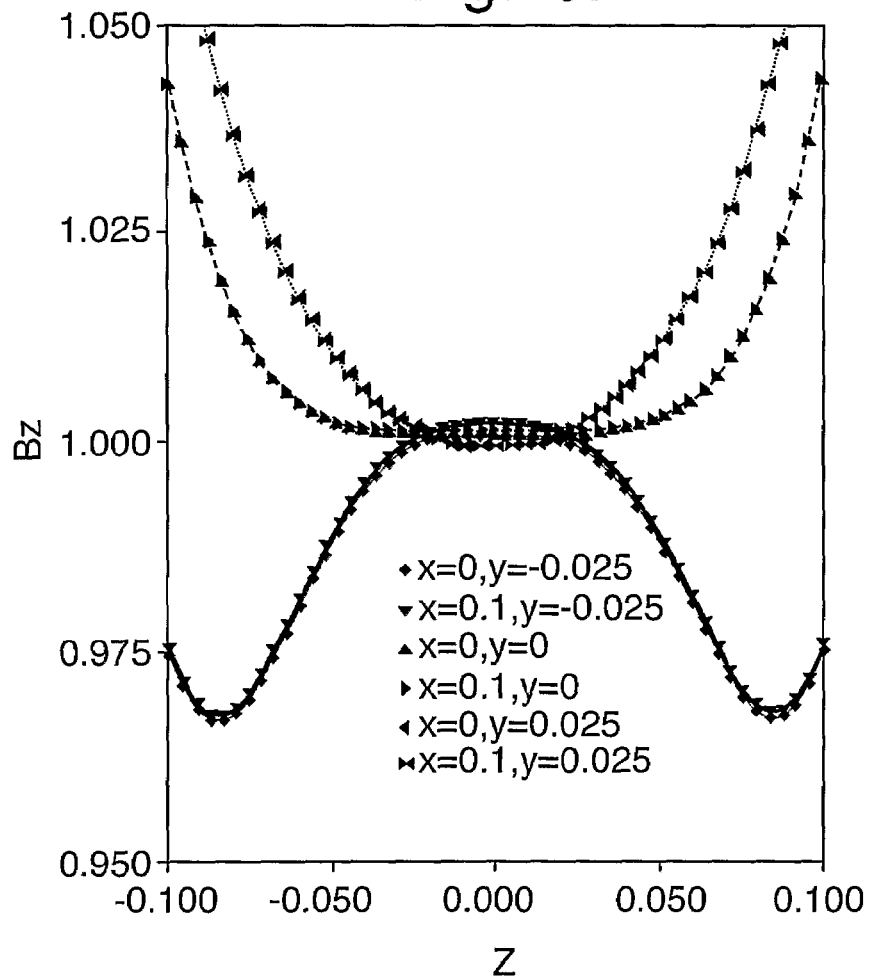
FIG. 10 shows the corresponding field profiles.

This results in the field profiles shown in FIG. 10.

Figure 11:
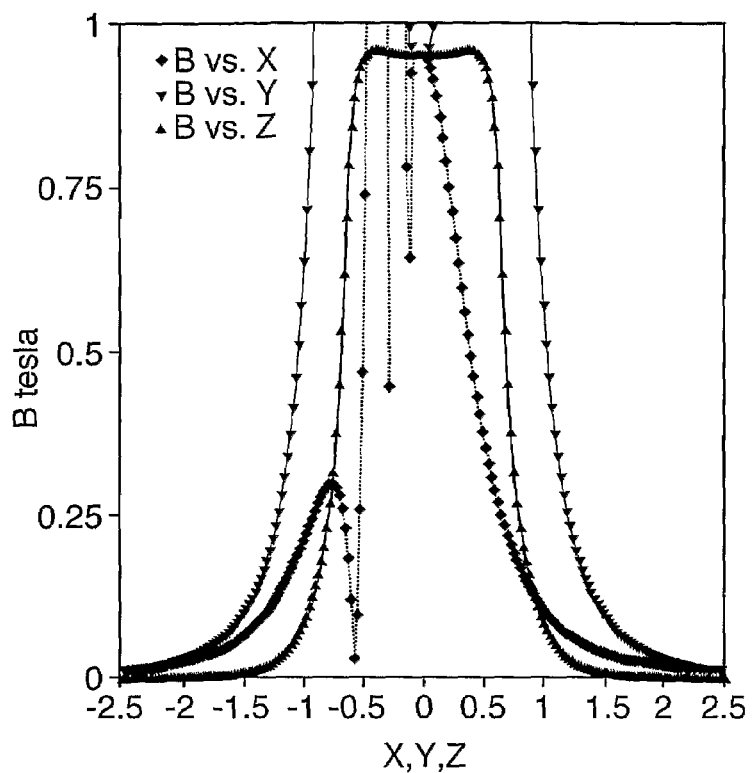
FIG. 11 shows the stray field behaviour.
Figure 12:
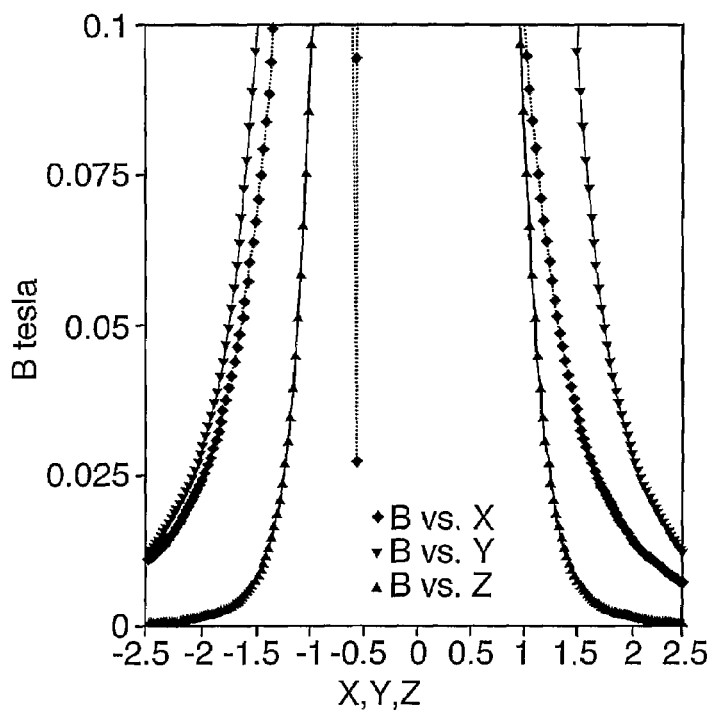
FIG. 12 shows part of the stray field behaviour of FIG. 11 in greater detail.

FIGS. 11 and 12 each show the field strength in tesla plotted against distance in three directions. The extent of the stray field is about two metres in all directions.

In the following examples, two pairs of coplanar race-track coils are optimised for field uniformity in the direction perpendicular to the plane of the coils. Two methods are used: choosing coils with zero first order and cancelling second order between the coils, or choosing zero second order and cancelling first order. The second method produces a greater volume of homogeneity. If the system is very long in the x-direction, the homogeneity volume is cylindrical. Field strength and volume of homogeneity are investigated as a function of the spacing between the centre of the working volume and the plane of the coils.

The previous discussion above described systems where the coil arrangement was designed to produce field uniformity over a plane parallel to the plane(s) containing the coils, with extension of the homogeneous volume in the Y-direction being an additional feature. We now consider producing a homogeneous region over a plane perpendicular to the plane containing the coils, that is, the XY plane.

The arrangement is again two pairs of racetrack coils as shown in FIG. 3.

The characteristics of a single coil were discussed earlier in relation to FIG. 4.

We now calculate the gradients in the Y direction:

$$G_{yn} = \frac{\partial^n B_z}{\partial y^n}\bigg|_{y=0, z=0}$$

Then $$G_{y0} = \frac{\mu_0 I d}{2\pi}\left\{\frac{1}{r_1^2} - \frac{1}{r_2^2}\right\}$$

$$G_{y1} = -\frac{\mu_0 I}{2\pi}\left\{\frac{1}{r_1^2} - \frac{1}{r_2^2} - \frac{2d^2}{r_1^4} + \frac{2d^2}{r_2^4}\right\}$$

$$G_{y2} = -\frac{\mu_0 I d}{2\pi}\left\{\frac{6}{r_1^4} - \frac{6}{r_2^4} - \frac{8d^2}{r_1^6} + \frac{8d^2}{r_2^6}\right\}$$

$$G_{y3} = \frac{\mu I}{2\pi}\left\{\frac{6}{r_1^4} - \frac{6}{r_2^4} - \frac{48d^2}{r_1^6} + \frac{48d^2}{r_2^6} + \frac{48d^4}{r_1^8} - \frac{48d^4}{r_2^8}\right\}$$

where $r_1^2 = d^2 + (b-a)^2$ and $r_2^2 = d^2 + (b+a)^2$

As one possible strategy according to a second example, we find the conditions for zero first order y gradient, $G_{y1} = 0$. These are $$a = \pm\left\{b + d^2 - 2d^2\{d^2 + b^2\}^{\frac{1}{2}}\right\}^{\frac{1}{2}} \quad b \leq \sqrt{3}d$$

$$= \pm\left\{b + d^2 + 2d^2\{d^2 + b^2\}^{\frac{1}{2}}\right\}^{\frac{1}{2}} \quad b \leq \sqrt{3}d$$

A second pair of coils can then be chosen so that the second-order y gradients cancel, leaving the third order, $G_{y3}$ as the dominant gradient.

Figure 13:
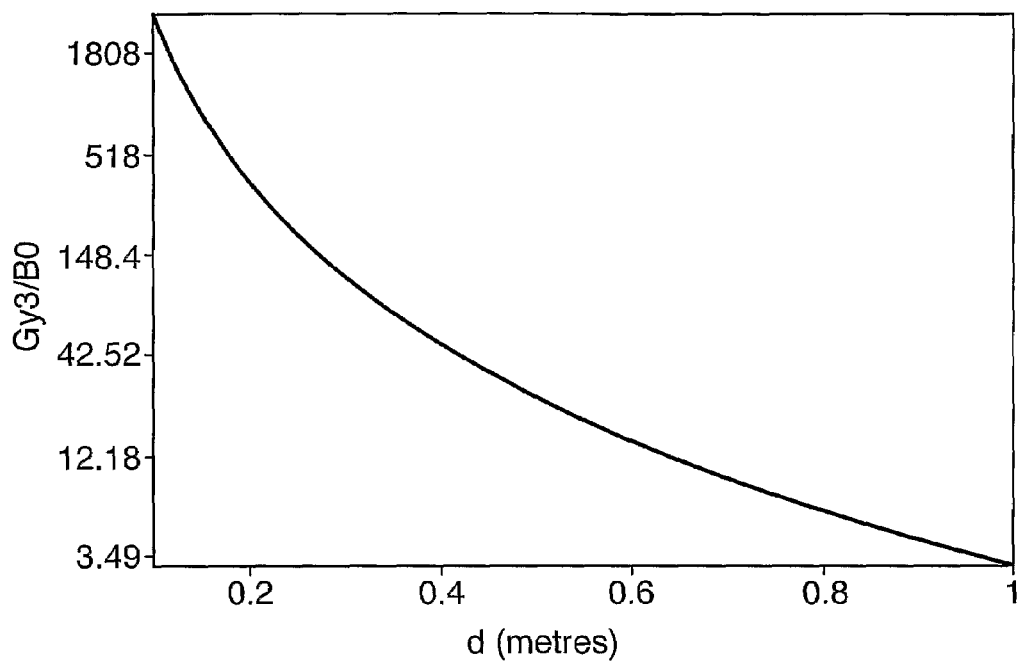
FIG. 13 shows the ratio of the third order gradient in Y to the field strength as a function of d according to a second example.

It turns out that with this system of zero $G_{y1}$ the ratio of third order to field strength, $G_{y3}/G_{z0}$ is independent of b, and a is only a function of d, the distance of the field centre from the coil plane. This is shown in FIG. 13.

Figure 14:
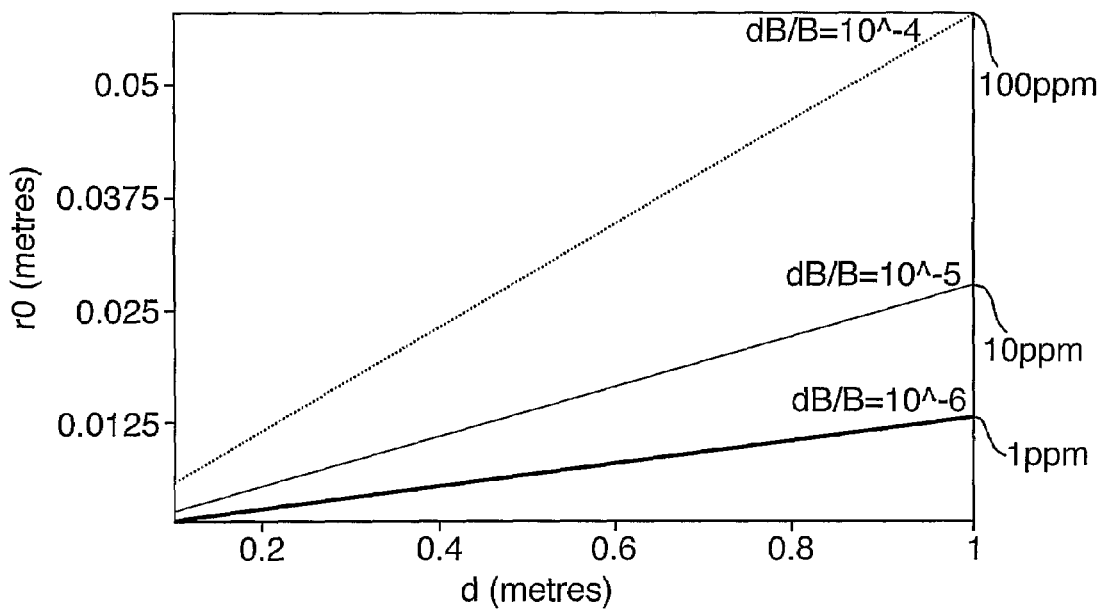
FIG. 14 shows the corresponding radius of the homogeneous volume as a function of distance from the centre for three levels of uniformity.

The implications for the size of the uniformity volume, $$r_0 = \sqrt{3! \cdot \frac{\partial B \cdot}{B_0} \frac{B_0}{G_{y3}}}$$

are shown in FIG. 14. Here the upper line indicates a uniformity of 100 ppm, the line beneath indicates 10 ppm, with a 1 ppm line beneath that.

A second possible strategy for two coil pairs according to a third example is to choose a so that $G_{y2}$ is zero. There does not seem to be an analytical solution to this, but the expression for $G_{y2}=0$ can be solved numerically for a as a function of b. These results are shown FIG. 15, for d=0.25 m, as earlier.

Figure 15:
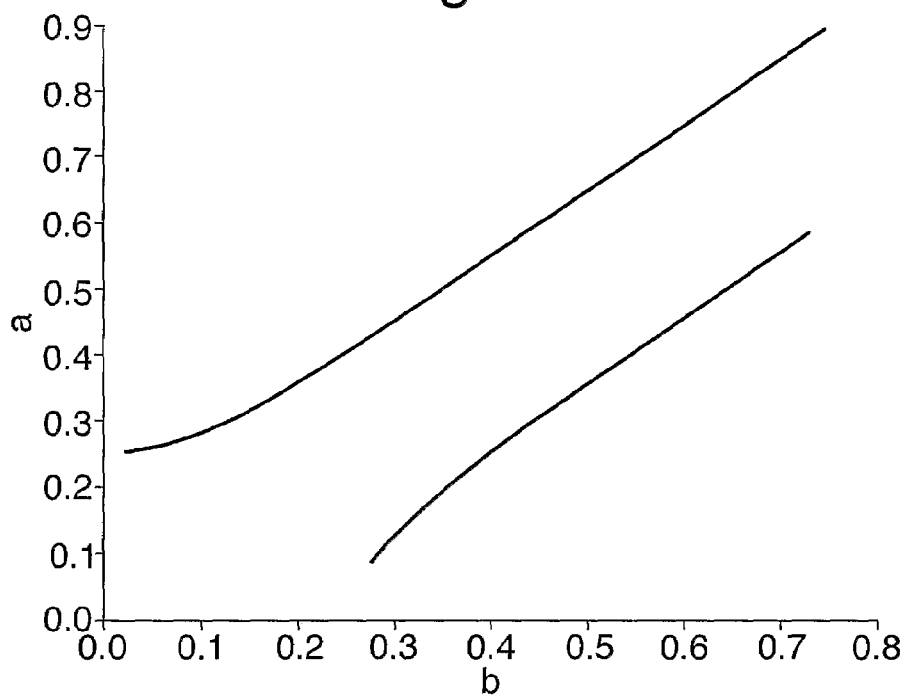
FIG. 15 shows a plotted against b for zero second order Y according to a third example.
Figure 16:
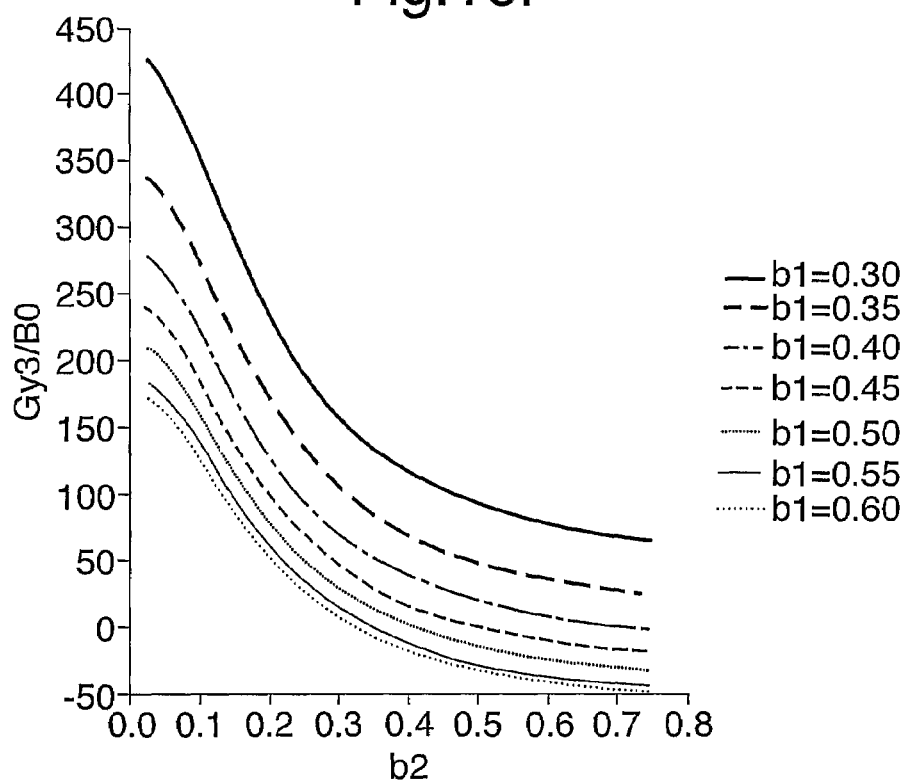
FIG. 16 shows the ratio of third order Y as a function of $b_2$ for various $b_1$.

As FIG. 15 indicates, it is therefore possible to define systems with two pairs of coils, characterised by $a_1$, $b_1$ and $a_2$, $b_2$ with $a_1$, $a_2$ chosen in the manner described above, to produce zero $G_{y2}$, and then have a ratio of ampere-turns so that the first-order gradients $G_{y1}$ cancel. FIG. 16 plots $G_{y3}/B_0$ (the dominant gradient) against $b_2$ for a range of values of $b_1$.

Figure 17:
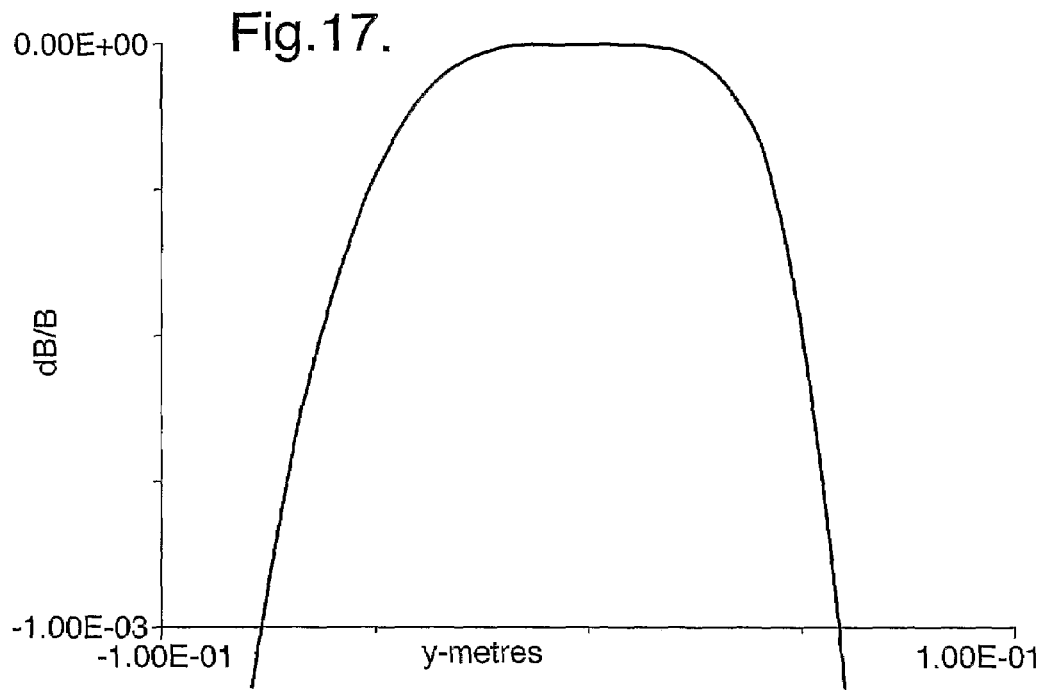
FIG. 17 shows the field as a function of the Y direction for the third example.
Figure 18:
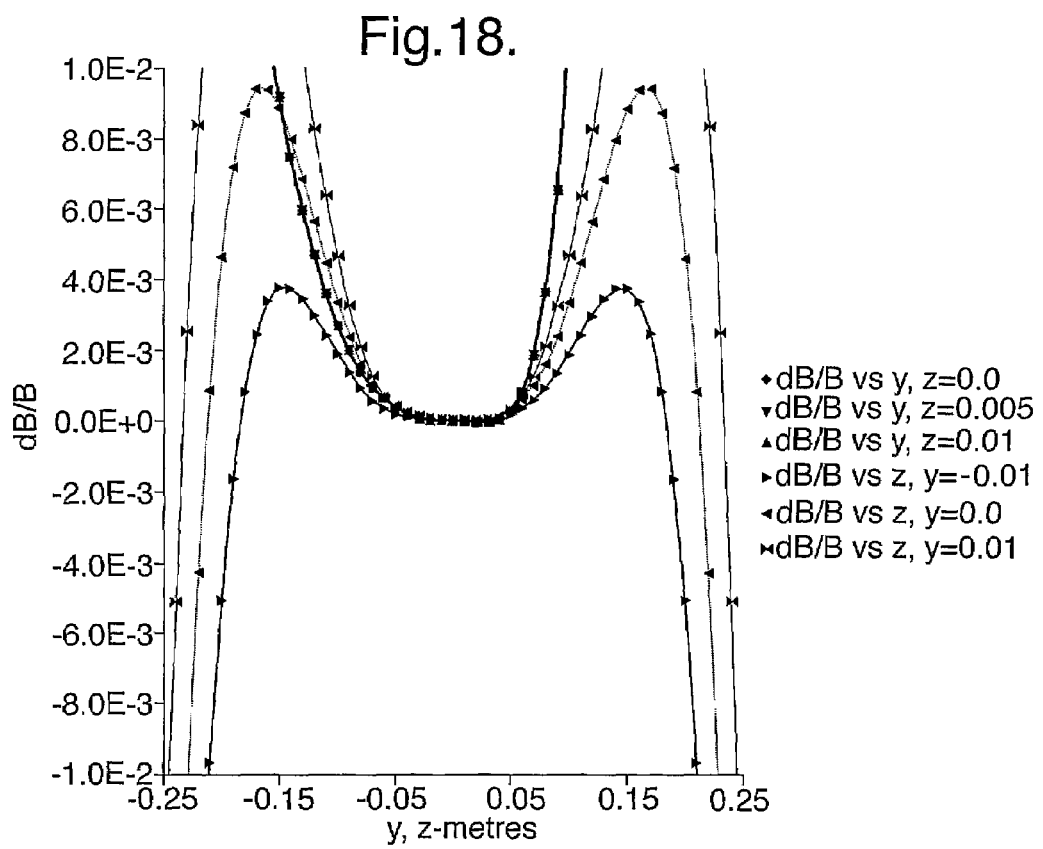
FIG. 18 shows the field plots for the third example in the Y and Z directions.
Figure 19:
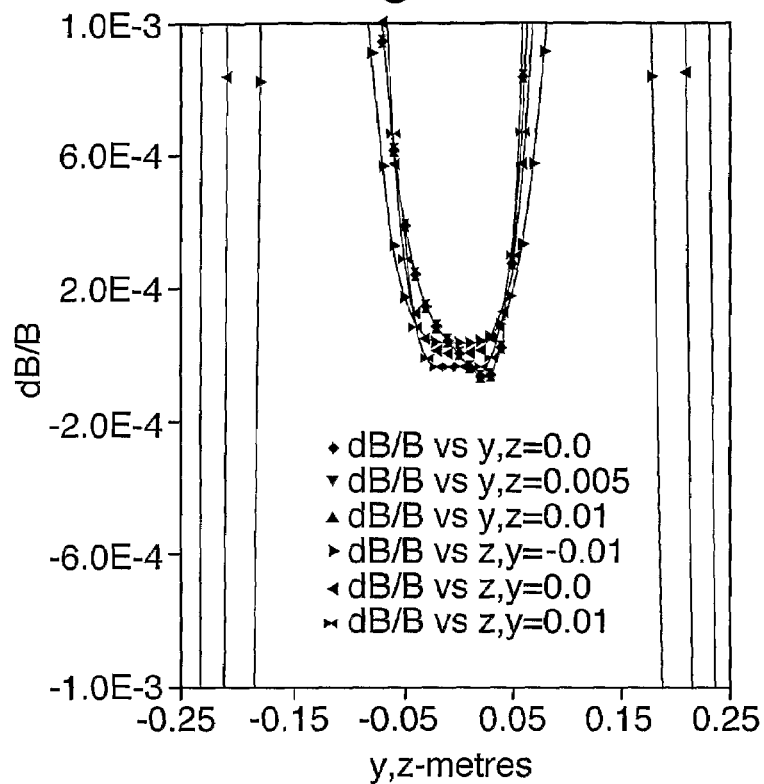
FIG. 19 shows part of FIG. 18 in more detail.
Figure 20:
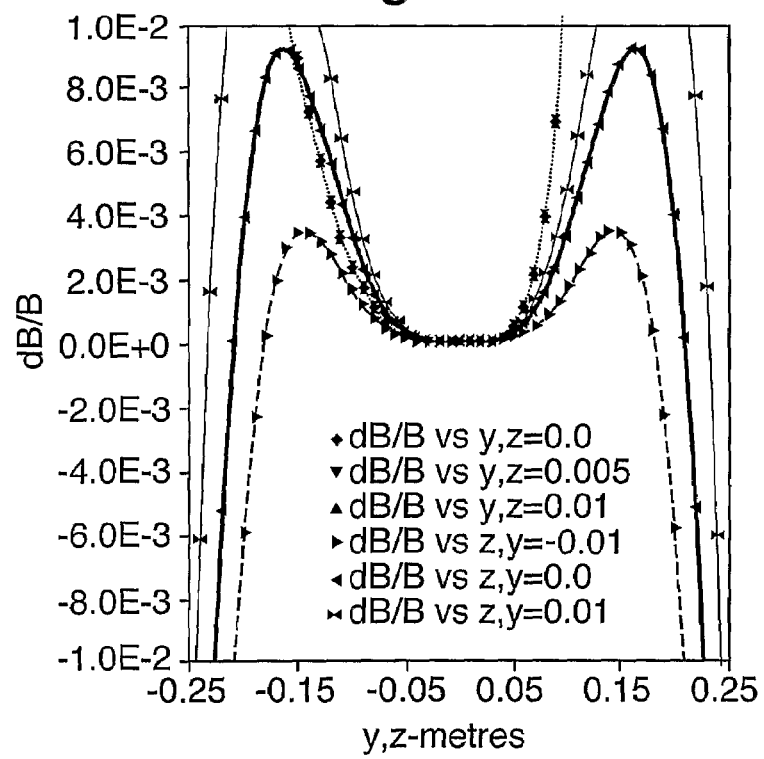
FIG. 20 shows field plots for a fourth example similar to the third, in the Y and Z directions.
Figure 21:
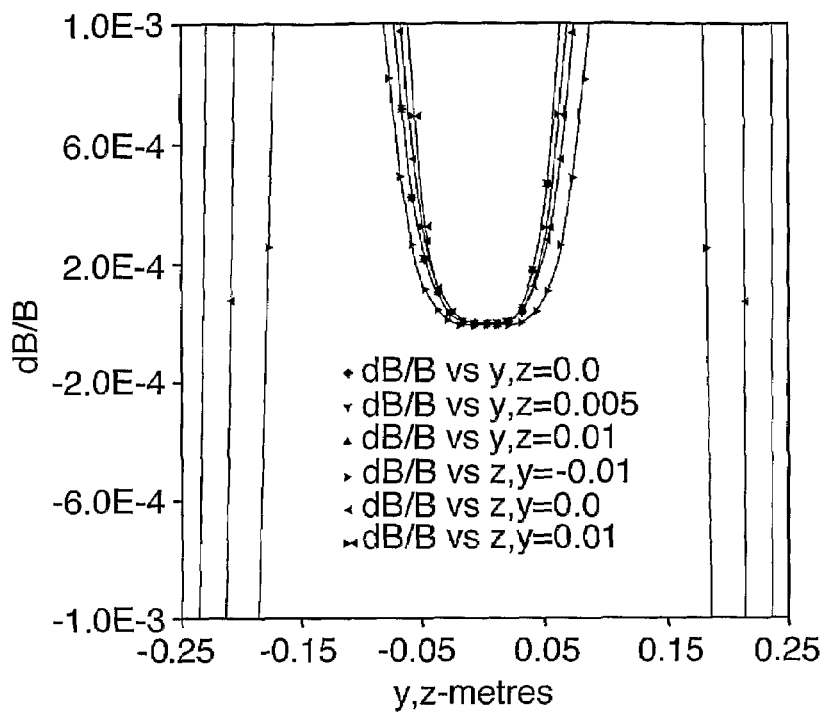
FIG. 21 shows part of FIG. 20 in more detail.

As can be seen, for $b_1 > 0.4$ m there exist values of $b_2$ for which the third order gradient, $G_{y3}$ is also zero. A typical field plot in the Y-direction is shown in FIG. 17 (with the residual first-order taken out).

The fourth-order gradient of $1.13 \times 10^3$ T/m$^3$/T limits the size of the homogeneous volume to about ±40 mm at the $$\frac{\delta B}{B} = 10^{-4}$$

level.

Table 3 summarises the properties of a range of similar systems. A first group (refs 1 to 5) has its members taken from both branches of the $G_{y2}=0$ curve, and a second (refs 6 to 10) has both members from the same branch:

TABLE 3

| ref: | b1 | a1 | b2 | a2 | ratio | B0/NI | $G_{yd}/B0$ | $G_{y5}/B0$ |
|---|---|---|---|---|---|---|---|---|
| 1 | 0.400 | 0.24815 | 0.725 | 0.86962 | −1.09176 | −1.527E−7 | −1.19036E+03 | −4.60766E+04 |
| 2 | 0.450 | 0.30109 | 0.500 | 0.64534 | −1.04923 | −7.847E−8 | −1.21445E+03 | −4.59655E+04 |
| 3 | 0.500 | 0.35273 | 0.400 | 0.54636 | −1.01238 | −1.976E−8 | −9.55466E+03 | −2.09107E+05 |
| 4 | 0.550 | 0.40370 | 0.350 | 0.49734 | −0.98614 | 2.755E−8 | −9.72326E+02 | −3.70626E+04 |
| 5 | 0.600 | 0.45430 | 0.325 | 0.47304 | −0.96780 | 6.054E−8 | −1.03235E+03 | −3.84522E+04 |
| 6 | 0.250 | 0.40171 | 0.700 | 0.84466 | −1.08868 | −1.482E−7 | −1.18309E+03 | −4.60584E+04 |
| 7 | 0.300 | 0.44895 | 0.500 | 0.64534 | −1.04943 | −7.908E−8 | −1.21551E+03 | −4.60605E+04 |
| 8 | 0.350 | 0.49734 | 0.400 | 0.54636 | −1.01307 | −2.102E−8 | −1.20023E+03 | −4.60670E+04 |
| 9 | 0.400 | 0.54636 | 0.350 | 0.49734 | −0.98710 | 2.075E−8 | −1.20002E+03 | −4.60617E+04 |
| 10 | 0.450 | 0.59574 | 0.325 | 0.47304 | −0.96882 | 4.926E−8 | −1.22744E+03 | −4.60723E+04 |

The fourth order is typically $1 \times 10^3$ and the fifth order $4 \times 10^5$. The sixth order is typically $1 \times 10^6$. These gradients limit the size of the homogeneous region to $y = \pm 40$, 50 and 64 mm respectively at $$\frac{\delta B}{B} = 10^{-4}$$

and imply that the gains in size by cancelling higher orders using more complex systems are not likely to be substantial. There is very little to choose between these systems. The system with the largest value of $B_0/NI$ from each group was examined in more detail (numbers 1 and 6). Field plots for these, as examples 3 and 4 respectively, on two scales are shown in FIGS. 18 and 19, and 20 and 21.

There appears to be no practical difference between these two arrangements. Note also that the volume of uniformity extends as far in the Z-direction as in the Y-direction. This is a consequence of the divergence theorem, given that the length of the coils makes the field uniform in this direction. The volume of uniformity is therefore a cylinder of diameter 80 mm, and whose length is determined by the length of the coils.

In order to investigate scaling effects, a range of such systems was computed as in Table 4.

TABLE 4

| ref | b1 | a1 | b2 | a2 | Ratio | B0tot |
|---|---|---|---|---|---|---|
| d = 0.20 | | | | | | |
| 11 | 0.325 | 0.20390 | 0.525 | 0.64079 | 1.08274 | −1.733E−7 |
|  | 0.350 | 0.23041 | 0.425 | 0.54113 | −1.05824 | −1.174E−7 |
| 12 | 0.200 | 0.32137 | 0.550 | 0.66575 | −1.08695 | −1.830E−7 |
|  | 0.250 | 0.36877 | 0.375 | 0.49146 | −1.03960 | −7.909E−8 |
| d = 0.25 | | | | | | |
| 13 | 0.400 | 0.24815 | 0.725 | 0.86962 | −1.09176 | −1.527E−7 |
|  | 0.425 | 0.27485 | 0.575 | 0.71997 | −1.06850 | −1.116E−7 |
|  | 0.450 | 0.30109 | 0.500 | 0.64534 | −1.04923 | −7.847E−8 |
| 14 | 0.250 | 0.40171 | 0.700 | 0.84466 | −1.08868 | −1.482E−7 |
|  | 0.300 | 0.44895 | 0.500 | 0.64534 | −1.04943 | −7.908E−8 |
| d = 0.30 | | | | | | |
| 15 | 0.325 | 0.50545 | 0.725 | 0.89885 | −1.07411 | −9.984E−8 |
|  | 0.350 | 0.52918 | 0.625 | 0.79926 | −1.05546 | −7.438E−8 |
| d = 0.35 | | | | | | |
| 16 | 0.450 | 0.65742 | 0.625 | 0.82909 | −1.03209 | −3.681E−8 |
| d = 0.40 | | | | | | |
| 17 | 0.550 | 0.78600 | 0.675 | 0.90869 | −1.02042 | −2.002E−8 |

The referenced systems were examined in more detail and Table 5 shows the higher-order gradients and the notional radius (r0) of a uniformity volume limited by each gradient.

Figure 22:
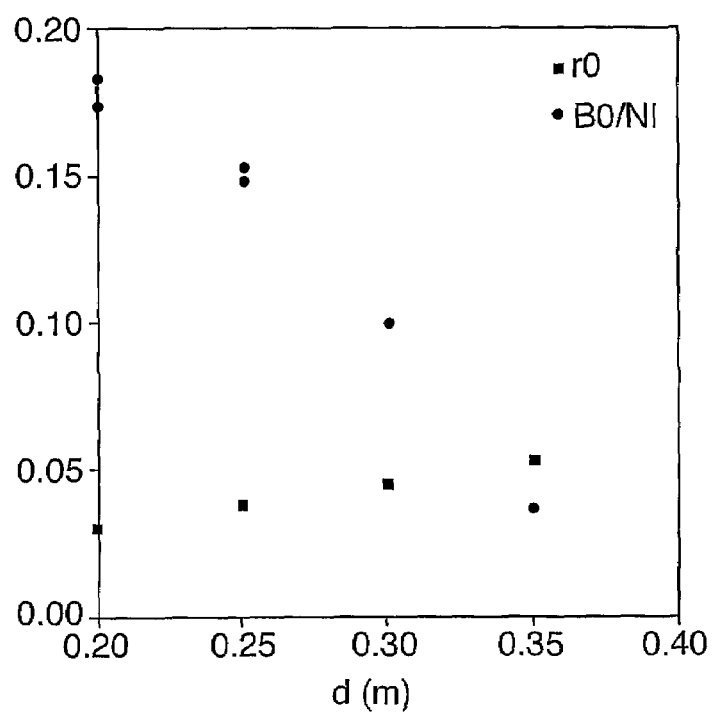
FIG. 22 shows the effect of scaling systems of the type according to the third and fourth examples.

As is to be expected, the size of the homogeneous volume scales directly with the spacing between the coils and the working volume centre. FIG. 22 shows the field strength in micro-teslas per ampere-turn and r0 in metres, each plotted against d, also in metres.

Examples 2 to 4 described systems where the coil arrangement was designed to produce field uniformity over an approximately cylindrical volume. The length of the cylinder was effectively determined by the length of the racetrack coils. We now describe how the length of the uniformity volume can be extended relative to the length of the coils.

Various examples of coil systems are described above, but these achieved field uniformity in the X direction only by being relatively long.

Figure 23:
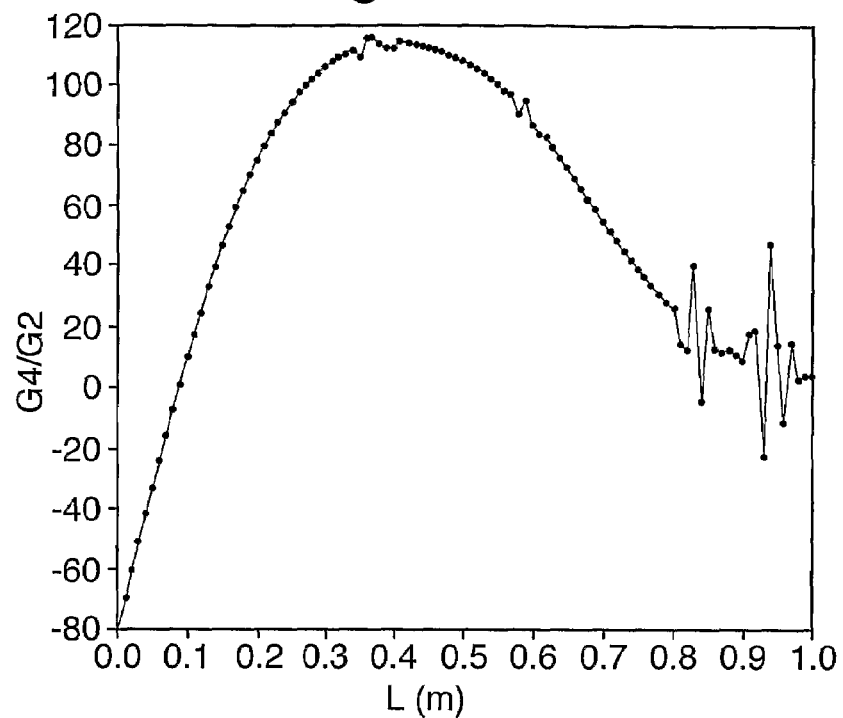
FIG. 23 shows the $G_4$ to $G_2$ ratio as a function of coil length for the third example.

In a fifth example, if we take the third example (reference number 1) and plot the ratio $G_{x4}/G_{x2}$ where $$G_{xn} = \left.\frac{\partial^n B_z}{\partial x^n}\right|$$

we obtain a result shown in FIG. 23.

Figure 24:
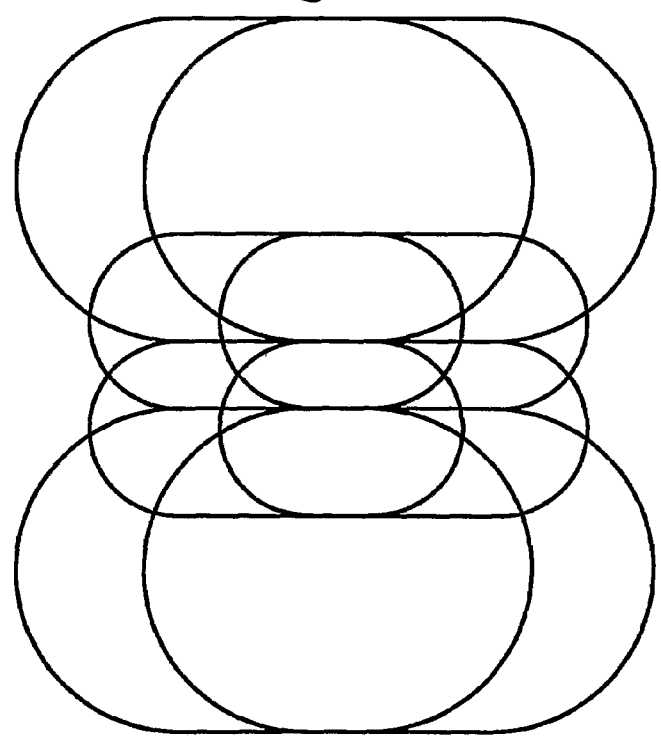
FIG. 24 shows a shortened coil arrangement according to a fifth example.

FIG. 23 shows that, for positive values of the ratio, there are two possible coil lengths. We can choose two such lengths, such as 0.15 m (short coil pair) and 0.722 m (long coil pair). By having two such systems (each of four coils) with the ampere-turns in the same ratio as the $G_{x2}$s, we cancel both the second and the fourth order z-gradients. Because zero orders do not cancel, the combined system produces a net field. The arrangement is shown in FIG. 24.

Further details of the coils are given in Table 6

TABLE 6

| coil | I | d | a | b | L |
|---|---|---|---|---|---|
| 1 | 30327 | 0.25 | 0.24815 | 0.400 | 0.15 |
| 2 | −30327 | 0.25 | −0.24815 | 0.400 | 0.15 |
| 3 | −33110 | 0.25 | 0.86962 | 0.725 | 0.15 |
| 4 | 33110 | 0.25 | −0.86962 | 0.725 | 0.15 |
| 5 | −3384500 | 0.25 | 0.24815 | 0.400 | 0.722 |
| 6 | 3384500 | 0.25 | −0.24815 | 0.400 | 0.722 |
| 7 | 3695000 | 0.25 | 0.86962 | 0.725 | 0.722 |
| 8 | −3695000 | 0.25 | −0.86962 | 0.725 | 0.722 |

The total conductor usage is $9.21 \times 10^7$ ampere-metres per tesla, and the gradients are shown in Table 7 with units T/m, T/m$^2$ and so on.

| Ref | D m | B0/NI | $G_{y4}/B0$ | r0 mm | $G_{y5}/B0$ | r0 mm | $G_{y6}/B0$ | r0 mm |
|---|---|---|---|---|---|---|---|---|
| 11 | 0.20 | 1.733E−7 | −2.87E+03 | 30 | −1.40E+05 | 39 | −4.99E+06 | 49 |
| 12 | 0.20 | 1.830E−7 | −2.86E+03 | 30 | −1.40E+05 | 39 | −4.99E+06 | 49 |
| 13 | 0.25 | 1.527E−7 | −1.19E+03 | 38 | −4.60E+04 | 48 | −1.30E+06 | 62 |
| 14 | 0.25 | 1.482E−7 | −1.18E+03 | 38 | −4.60E+04 | 48 | −1.30E+06 | 62 |
| 15 | 0.30 | 9.984E−8 | −5.85E+02 | 45 | −1.85E+04 | 58 | −4.31E+05 | 74 |
| 16 | 0.35 | 3.681E−8 | −3.13E+02 | 53 | −8.56E+03 | 68 | −1.70E+05 | 87 |
| 17 | 0.40 | 2.002E−8 | −1.87E+02 | 60 | −4.39E+03 | 77 | −8.97E+04 | 96 |

Table 7

FIELD DERIVATIVES Partial derivatives w.r.t. X, range 0.1 gradients at [0, 0, 0]

| Order | y-comp | z-comp | x-comp | mod |
|---|---|---|---|---|
| 0 | 1.34495E−08 | 1.00002E+00 | −2.67488E−08 | 1.00002E+00 |
| 1 | −3.72048E−07 | 3.44691E−09 | −1.77649E−09 | 3.44691E−09 |
| 2 | 1.78808E−07 | 3.68545E−02 | 3.28066E−07 | 3.68545E−02 |
| 3 | −3.42298E−07 | 8.97325E−08 | −2.73136E−07 | 8.95999E−08 |
| 4 | 6.91050E−06 | 1.72840E+00 | 1.19007E−05 | 1.72840E+00 |
| 5 | 7.50013E−05 | −5.33570E−05 | −2.36006E−05 | −5.10530E−05 |
| 6 | 4.76493E−03 | −2.62150E+03 | 7.12905E−03 | −2.62150E+03 |
| 7 | −2.00951E−01 | 4.72646E−01 | −4.40400E−02 | 4.49363E−01 |
| 8 | −5.84140E+01 | 1.20655E+07 | −9.31318E+01 | 1.20656E+07 |

FIELD DERIVATIVES Partial derivatives w.r.t. Y, range 0.1 gradients at [0, 0, 0]

| Order | y-comp | z-comp | x-comp | mod |
|---|---|---|---|---|
| 0 | 1.34495E−08 | 1.00002E+00 | −2.67488E−08 | 1.00002E+00 |
| 1 | 1.69333E−06 | 1.01886E−01 | −3.73372E−07 | 1.01886E−01 |
| 2 | 2.93393E−05 | 3.84145E−02 | −2.83476E−06 | 3.84145E−02 |
| 3 | 4.20487E−04 | −1.27298E+00 | −2.23435E−05 | −1.27298E+00 |
| 4 | 5.34113E−03 | −1.22570E+03 | −1.59132E−04 | −1.22570E+03 |
| 5 | 4.22340E−02 | −4.72369E+04 | 4.13774E−04 | −4.72369E+04 |
| 6 | −8.75608E−01 | −1.33512E+06 | 7.51060E−02 | −1.33512E+06 |
| 7 | −7.62691E+01 | −3.28269E+07 | 3.05920E+00 | −3.28269E+07 |
| 8 | −3.17884E+03 | −6.10807E+08 | 5.68830E+01 | −6.10807E+08 |

FIELD DERIVATIVES Partial derivatives w.r.t. Z, range 0.1 gradients at [0, 0, 0]

| Order | y-comp | z-comp | x-comp | mod |
|---|---|---|---|---|
| 0 | 1.34495E−08 | 1.00002E+00 | −2.67488E−08 | 1.00002E+00 |
| 1 | 1.01886E−01 | 2.01028E−06 | −5.84758E−09 | 2.01165E−06 |
| 2 | 1.80926E−06 | −7.52745E−02 | 2.50462E−06 | −6.48941E−02 |
| 3 | 1.96676E−01 | 3.25577E−05 | −1.69456E−08 | 3.30505E−05 |
| 4 | 1.33470E−03 | −1.21238E+03 | −1.63779E−04 | −1.21229E+03 |
| 5 | −4.71616E+04 | −2.45743E+00 | −5.45790E−04 | −2.45735E+00 |
| 6 | −1.77372E+00 | 1.33313E+06 | −7.46778E−02 | 1.30418E+06 |
| 7 | 3.23096E+07 | 2.20923E+04 | 5.23538E−01 | 2.20898E+04 |
| 8 | 1.28011E+03 | −6.61422E+08 | 1.04632E+02 | −6.23215E+08 |

Figure 25:
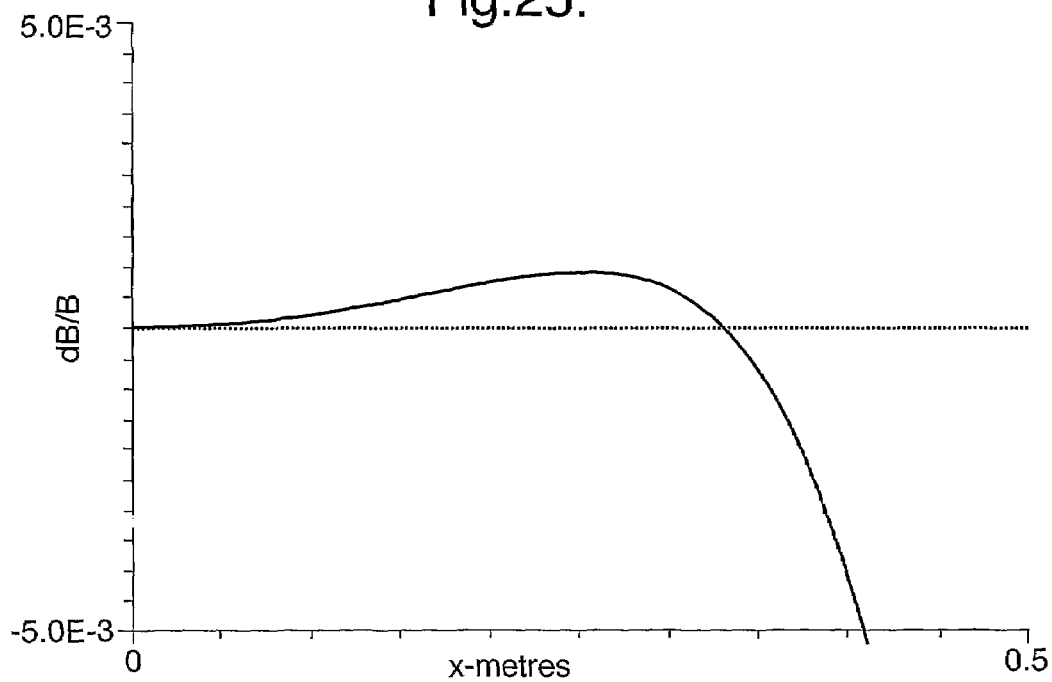
FIG. 25 shows the field profile of the fifth example as a function of X.
Figure 26:
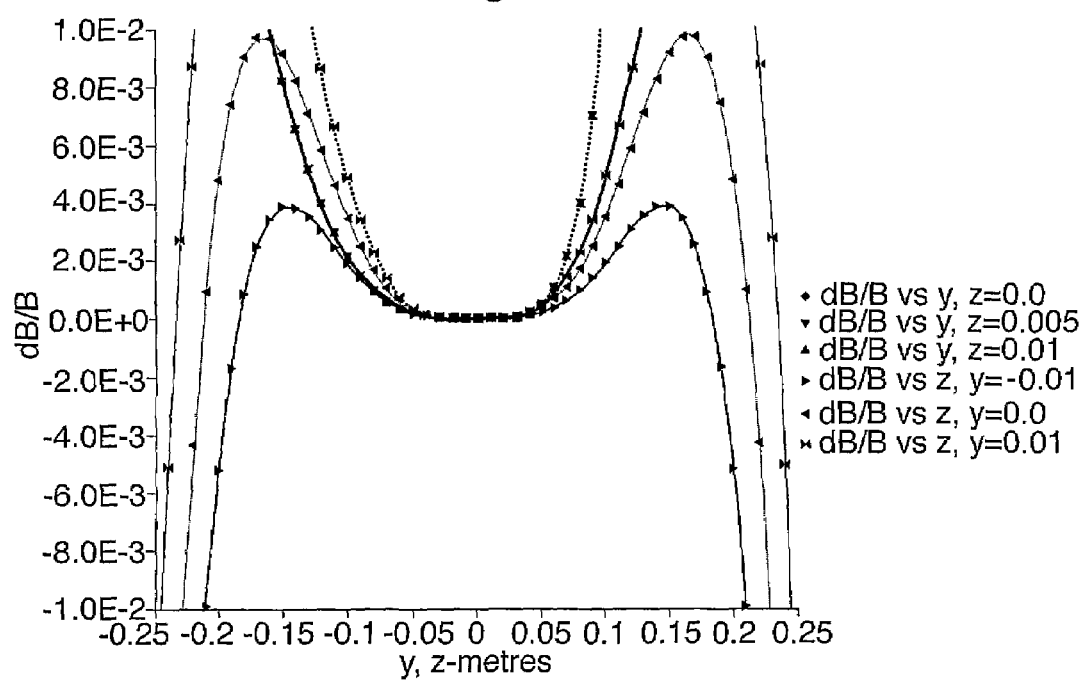
FIG. 26 shows the field profile of the fifth example as a function of Y and Z.
Figure 27:
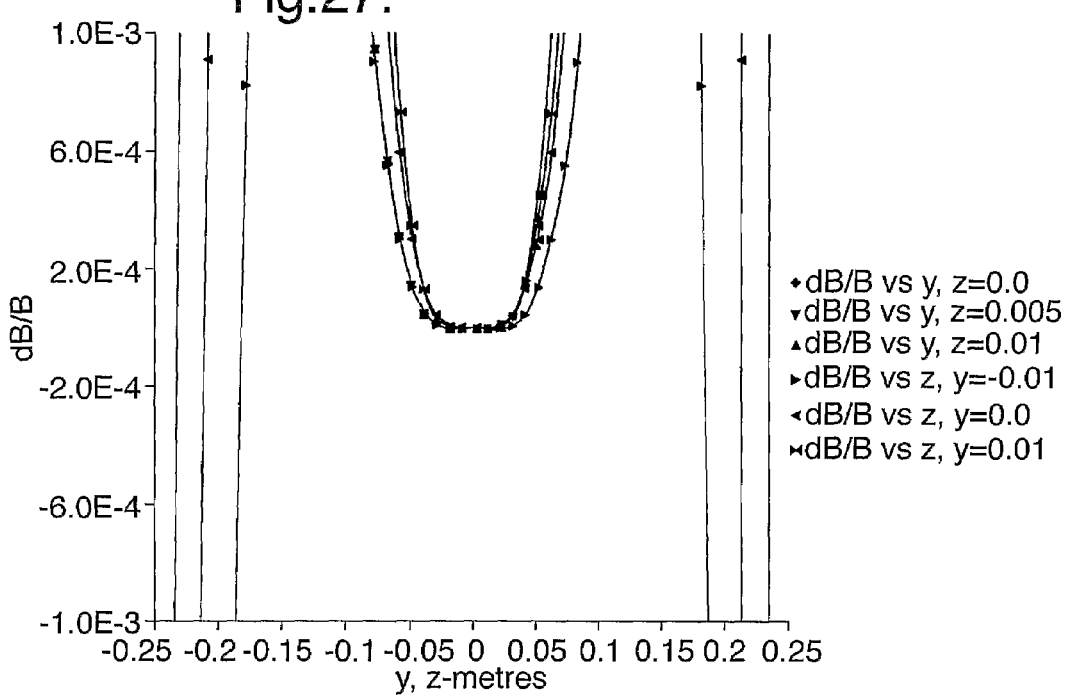
FIG. 27 shows the field profile of part of FIG. 26 in more detail.

The field properties are shown in FIGS. 25, 26 and 27 (with a residual y gradient removed).

In a further sixth example, an alternative scheme, based on the same system as the fifth example but with different lengths is shown in Table 8.

TABLE 8

| coil | I | d | a | b | L |
|---|---|---|---|---|---|
| 1 | 30438 | 0.25 | 0.24815 | 0.400 | 0.20 |
| 2 | −30438 | 0.25 | −0.24815 | 0.400 | 0.20 |
| 3 | −33231 | 0.25 | 0.86962 | 0.725 | 0.20 |
| 4 | 33231 | 0.25 | −0.86962 | 0.725 | 0.20 |
| 5 | −3396940 | 0.25 | 0.24815 | 0.400 | 0.641 |
| 6 | 3396940 | 0.25 | −0.24815 | 0.400 | 0.641 |
| 7 | 3708640 | 0.25 | 0.86962 | 0.725 | 0.641 |
| 8 | −3708640 | 0.25 | −0.86962 | 0.725 | 0.641 |

The total conductor usage is $8.79 \times 10^7$ ampere-metres per tesla, and the other results are much the same as above.

Figure 28:
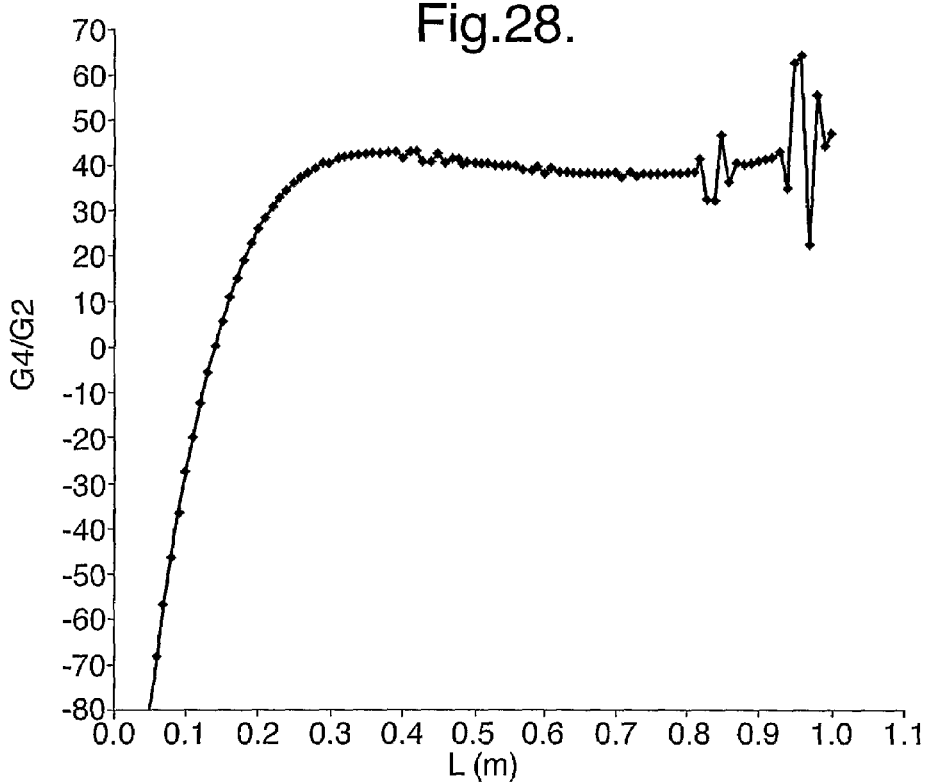
FIG. 28 shows the ratio of $G_4$ to $G_2$ as a function of coil length for the fourth example.

Taking the earlier fourth example (reference number 6) and plotting the ratio $$\frac{G_{x4}}{G_{x2}} = \frac{\partial^n B_z}{\partial_x^n}\bigg|$$

we obtain a behaviour shown in FIG. 28.

In this case, the choice for two different values of L is rather more limited. We choose 0.3 and 0.502 m. Table 9 provides the relevant details.

TABLE 9

| coil | I | d | a | b | L |
|---|---|---|---|---|---|
| 1 | 1.32811e+06 | 0.25 | 0.40171 | 0.250 | 0.30 |
| 2 | −1.32811e+06 | 0.25 | −0.40171 | 0.250 | 0.30 |
| 3 | −1.44588e+06 | 0.25 | 0.84466 | 0.700 | 0.30 |
| 4 | 1.44588e+06 | 0.25 | −0.84466 | 0.700 | 0.30 |
| 5 | −4.76525e+06 | 0.25 | 0.40171 | 0.250 | 0.502 |
| 6 | 4.76525e+06 | 0.25 | −0.40171 | 0.250 | 0.502 |
| 7 | 5.18781e+06 | 0.25 | 0.84466 | 0.700 | 0.502 |
| 8 | −5.18781e+06 | 0.25 | −0.84466 | 0.700 | 0.502 |

Figure 29:
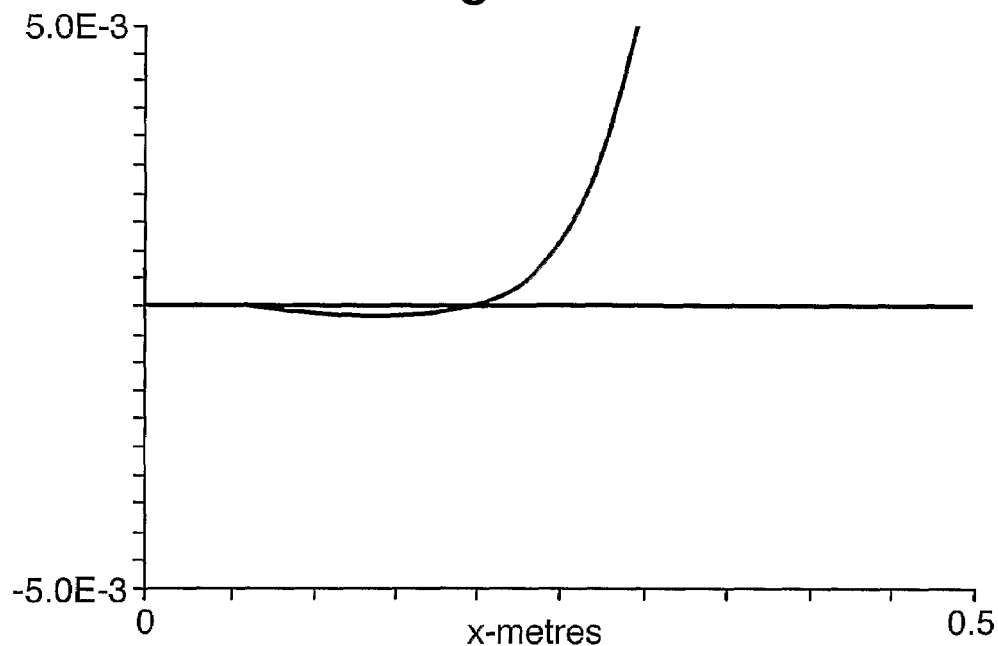
FIG. 29 shows the field profile of the sixth example as a function of Y and Z.
Figure 30:
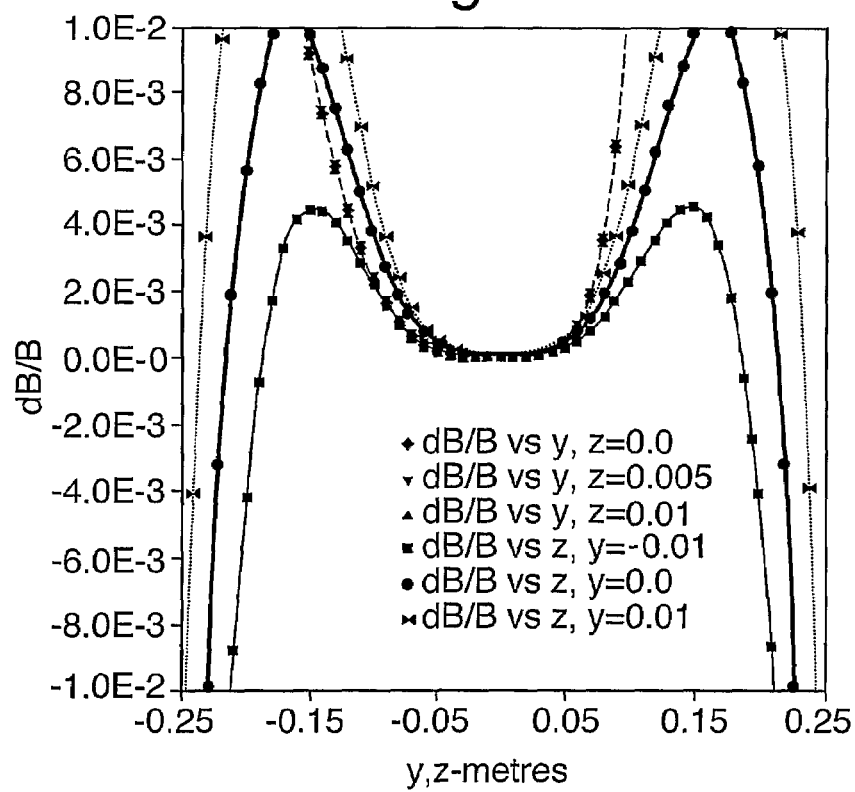
FIG. 30 shows the field profile of part of FIG. 29 in more detail.

The total conductor usage is $1.24 \times 10^8$ ampere-metres per tesla. The field profiles are shown in FIGS. 29, 30 and 31.

The present invention therefore provides a way to produce a magnet system having a sufficiently homogeneous magnetic field uniformity in a region spaced from the magnet coils so as to allow MRI and other magnetic procedures and experiments to be performed upon a target.

The invention claimed is:

1. Magnetic resonance apparatus comprising a magnet having a plurality of pairs of air-cored coils arranged in respective substantially parallel planes, the air-cored coils in each pair being adapted to be operated in a counter-running manner when in use so as to generate a region of magnetic field spaced apart from said planes, having sufficient uniformity to enable magnetic resonance signals to be obtained from a target within the region and having a magnetic field direction Z lying substantially parallel to said planes, wherein each of the air-cored coils is elongate in a direction X substantially parallel to said planes, and wherein two pairs of said air-cored coils have a relatively short elongation in the direction X and two pairs of said air-cored counter-running coils have a relatively long elongation in the direction X, the current being arranged to flow in one sense in one of the pairs of each length, and in the opposite sense in the other of the pairs of each length so as to substantially cancel the second and fourth derivatives of the magnetic field with respect to the direction X at the centre of the said region.

2. Magnetic resonance apparatus according to claim 1, wherein the elongation of the coils in the direction X determines the dimension of the region in the direction X.

3. Magnetic resonance apparatus according to claim 2, wherein the magnet further comprises a further pair of counter-running air-cored coils defining a further plane, substantially parallel to the said parallel planes, the further pair of coils being arranged to determine the dimension of the region in a direction Y that is substantially perpendicular to the X and Z directions.

4. Magnetic resonance apparatus according to claim 3, wherein the coils of the third pair are each elongate in substantially the X direction.

5. Magnetic resonance apparatus according to claim 3 wherein two or more of the planes are coincident.

6. Magnetic resonance apparatus according to claim 1, wherein the region is arranged to be to one side of and separate from the planes.

7. Magnetic resonance apparatus according to claim 1 wherein each of the coils within a pair has an axis substantially perpendicular to the turns of the coil and which is substantially perpendicular to its respective plane.

8. Magnetic resonance apparatus according to claim 1, wherein each coil within one or more pairs is substantially elliptical, having a major axis in the X direction.

9. Magnetic resonance apparatus according to claim 1, wherein part of each coil within one or more pairs is rectilinear in the X direction.

10. Magnetic resonance apparatus according to claim 9, wherein each coil within one or more pairs has two parallel rectilinear parts.

11. Magnetic resonance apparatus according to claim 10, wherein the part of each coil joining two rectilinear sections defines a single curve.

12. Magnetic resonance apparatus according to claim 1, wherein the coils are formed from high temperature superconducting materials.

13. Magnetic resonance apparatus according to claim 1, wherein each coil has two opposing ends, the opposing ends of each coil in one or more of the pairs are angled out of the corresponding plane so as to increase the homogeneity of the region within the direction X in comparison with similar coils lying wholly within a plane.

14. Magnetic resonance apparatus according to claim 1, wherein the coils are adapted such that at the centre of said region the fourth derivative of the magnetic field with respect to the direction Z is substantially zero.

15. Magnetic resonance apparatus according to claim 1, wherein the coils are adapted such that at the centre of the said region the second derivative of the magnetic field with respect to the direction Z is cancelled.

16. Magnetic resonance apparatus according to claim 1, wherein the coils are adapted such that at the centre of said region the first derivative of the magnetic field with respect to a direction Y is cancelled.

17. Magnetic resonance apparatus according to claim 1, wherein the coils are adapted such that at the centre of the said region the derivatives of order greater than 2, of the magnetic field with respect to a direction Y are cancelled.

18. Magnetic response apparatus according to claim 1, wherein the coil pairs are adapted such that at the centre of the said region the first derivative of the magnetic field with respect to a direction Y is substantially zero and the second derivative of the magnetic field with respect to the direction Y substantially cancels.

19. Magnetic resonance apparatus according to claim 1, wherein the coil pairs are adapted such that at the centre of the said region the second derivative of the magnetic field with respect to a direction Y is substantially zero and the first derivative of the magnetic field with respect to the direction Y substantially cancels.

20. Magnetic resonance apparatus according to claim 1, wherein the respective planes of the coils pass through the effective centroids of the coil windings.

* * * * *